(12) United States Patent
Kim et al.

(10) Patent No.: US 12,446,381 B2
(45) Date of Patent: Oct. 14, 2025

(54) DISPLAY DEVICE AND METHOD OF FABRICATING THE SAME

(71) Applicant: Samsung Display Co., LTD., Yongin-si (KR)

(72) Inventors: Kyung Bae Kim, Seongnam-si (KR); Do Yeong Park, Hwaseong-si (KR); Yong Hee Lee, Suwon-si (KR); Jong Woong Chang, Seoul (KR); Ki Hyun Pyo, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 366 days.

(21) Appl. No.: 18/152,709

(22) Filed: Jan. 10, 2023

(65) Prior Publication Data

US 2023/0282795 A1  Sep. 7, 2023

(30) Foreign Application Priority Data

Mar. 7, 2022  (KR) .................. 10-2022-0029016

(51) Int. Cl.
| | | |
|---|---|---|
| *H01L 33/62* | (2010.01) | |
| *H01L 25/16* | (2023.01) | |
| *H10D 86/40* | (2025.01) | |
| *H10D 86/60* | (2025.01) | |
| *H10H 20/857* | (2025.01) | |
| *H10H 20/01* | (2025.01) | |

(52) U.S. Cl.
CPC ......... *H10H 20/857* (2025.01); *H01L 25/167* (2013.01); *H10D 86/441* (2025.01); *H10D 86/60* (2025.01); *H10H 20/0364* (2025.01)

(58) Field of Classification Search
CPC ............. H10H 20/857; H10H 20/0364; H10H 20/819; H10H 29/142; H10H 20/831; H01L 25/167; H01L 25/0753; H10D 86/441; H10D 86/60; G09F 9/33
See application file for complete search history.

(56) References Cited

U.S. PATENT DOCUMENTS

2023/0140325 A1  5/2023  Lee et al.

FOREIGN PATENT DOCUMENTS

| EP | 4177949 A1 | 5/2023 |
|---|---|---|
| KR | 10-2020-0118937 A | 10/2020 |
| KR | 10-2021-0103602 A | 8/2021 |
| KR | 10-2021-0104392 A | 8/2021 |
| KR | 2023-0065430 A | 5/2023 |

*Primary Examiner* — Elmito Breval
(74) *Attorney, Agent, or Firm* — Womble Bond Dickinson (US) LLP

(57) ABSTRACT

A display device includes a substrate, first sub-pixels, second sub-pixels, and third sub-pixels on the substrate, the second sub-pixels being adjacent to the first sub-pixels, and third sub-pixels being spaced from the first sub-pixels with a respective one of the second sub-pixels therebetween, first electrodes and second electrodes on the substrate and located in the sub-pixels, first light-emitting elements, second light-emitting elements, and third light-emitting elements on the first electrodes and the second electrodes and located in the sub-pixels, each of the light-emitting elements comprising a first end and a second end opposite to the first end, and a first connection electrode, a second connection electrode, a third connection electrode, and a fourth connection electrode on the first to third light-emitting elements and located in the sub-pixels, wherein in the first sub-pixel, the first electrodes are extended in a first direction and are spaced from one another.

20 Claims, 12 Drawing Sheets

DISPLAY DEVICE AND METHOD OF FABRICATING THE SAME

CROSS-REFERENCE TO RELATED APPLICATION

This application claims priority to and the benefit of Korean Patent Application No. 10-2022-0029016 filed on Mar. 7, 2022 in the Korean Intellectual Property Office, the entire content of which is incorporated by reference herein.

BACKGROUND

1. Field

The present disclosure relates to a display device and a method of fabricating the same.

2. Description of the Related Art

Display devices become more and more important as multimedia technology evolves. Accordingly, a variety of types of display devices such as organic light-emitting diode (OLED) display devices and liquid-crystal display (LCD) devices are currently used.

As a display device for displaying images, there is a self-luminous display device including light-emitting elements. Examples of such a self-luminous display device may include an organic light-emitting display device using an organic material as the light-emitting material for the light-emitting elements, or an inorganic light-emitting display device using an inorganic material as the light-emitting material for the light-emitting elements.

SUMMARY

Aspects and features of embodiments of the present disclosure provide a display device that includes electrodes disposed across different pixels and that improves the brightness while reducing dark spots.

Aspects and features of embodiments of the present disclosure also provide a method of fabricating a display device that includes electrodes disposed across different pixels and that improves the brightness while reducing dark spots.

It should be noted that aspects and features of the present disclosure are not limited to the above-mentioned aspects and features, and other aspects and features of the present disclosure will be apparent to those skilled in the art from the following descriptions.

According to one or more embodiments of the present disclosure, a display device includes a substrate, first sub-pixels, second sub-pixels, and third sub-pixels on the substrate, the second sub-pixels being adjacent to the first sub-pixels, and the third sub-pixels being spaced from the first sub-pixels with a respective one of the second sub-pixels therebetween, first electrodes and second electrodes on the substrate and located in the sub-pixels, first light-emitting elements, second light-emitting elements, and third light-emitting elements on the first electrodes and the second electrodes and located in the sub-pixels, each of the light-emitting elements comprising a first end and a second end opposite to the first end, and a first connection electrode, a second connection electrode, a third connection electrode, and a fourth connection electrode on the first to third light-emitting elements and located in the sub-pixels, wherein in the first sub-pixel, the first electrodes are extended in a first direction and are spaced from one another in a second direction crossing the first direction, the second electrodes are extended in the first direction and are spaced from one another with the first electrode located on an opposite side in the second direction therebetween, the first light-emitting elements are between the first electrode located on the opposite side in the second direction and the second electrode located on the opposite side in the second direction, the second light-emitting elements are between the first electrode located on the opposite side in the second direction and the second electrode located on one side in the second direction, the third light-emitting elements are between the first electrode located on the one side in the second direction and the second electrode located on the one side in the second direction, the first connection electrode is in contact with the first end of the first light-emitting element, the second connection electrode is in contact with the second end of the third light-emitting element, the third connection electrode is in contact with the second end of the first light-emitting element and the first end of the second light-emitting element, and the fourth connection electrode is in contact with the second end of the second light-emitting element and the first end of the third light-emitting element, wherein the first sub-pixel, the second sub-pixel and the third sub-pixel are repeatedly arranged along the second direction, wherein the first end of the first light-emitting element and the first end of the third light-emitting element face the opposite side in the second direction, and wherein the first end of the second light-emitting element faces the one side in the second direction opposite to the opposite side in the second direction.

In the second sub-pixel, the first electrodes may be extended in the first direction and spaced from one another in the second direction, and the second electrodes may be extended in the first direction and spaced from one another with the first electrode located on the one side in the second direction therebetween.

In the second sub-pixel, the first light-emitting element may be between the first electrode located on the opposite side in the second direction and the second electrode located on the opposite side in the second direction, the second light-emitting element may be between the second electrode located on the opposite side in the second direction and the first electrode located on the one side in the second direction, and the third light-emitting element may be between the first electrode located on the one side in the second direction and the second electrode located on the one side in the second direction.

In the second sub-pixel, the first connection electrode may be in contact with the second end of the first light-emitting element, the second connection electrode may be in contact with the first end of the third light-emitting element, the third connection electrode may be in contact with the first end of the first light-emitting element and the second end of the second light-emitting element, and the fourth connection electrode may be in contact with the first end of the second light-emitting element and the second end of the third light-emitting element.

In the second sub-pixel, the first end of the first light-emitting element and the first end of the third light-emitting element may face the one side in the second direction whereas the first end of the second light-emitting element faces the opposite side in the second direction.

The first electrode located on the one side in the second direction in the first sub-pixel may be same as the first electrode located on the opposite side in the second direction in the second sub-pixel.

In the third sub-pixel, the first electrodes may be extended in the first direction and spaced from one another in the second direction, and the second electrodes may be extended in the first direction and spaced from one another with the first electrode located on the opposite side in the second direction therebetween.

In the third sub-pixel, the first light-emitting element may be between the first electrode located on the opposite side in the second direction and the second electrode located on the opposite side in the second direction, the second light-emitting element may be between the second electrode located on the one side in the second direction and the first electrode located on the opposite side in the second direction, and the third light-emitting element may be between the first electrode located on the one side in the second direction and the second electrode located on the one side in the second direction.

In the third sub-pixel, the first connection electrode may be in contact with the first end of the first light-emitting element, the second connection electrode may be in contact with the second end of the third light-emitting element, the third connection electrode may be in contact with the second end of the first light-emitting element and the first end of the second light-emitting element, and the fourth connection electrode may be in contact with the second end of the second light-emitting element and the first end of the third light-emitting element.

In the third sub-pixel, the first end of the first light-emitting element and the first end of the third light-emitting element may face the opposite side in the second direction whereas the first end of the second light-emitting element faces the one side in the second direction.

The first electrode located on the one side in the second direction in the first sub-pixel may be same as the first electrode located on the opposite side in the second direction in the second sub-pixel.

The display device may further comprise a first voltage line and a second voltage line between the substrate and the first electrodes, and between the substrate and the second electrodes.

The first voltage line may overlap with a boundary between the first sub-pixel and the third sub-pixel when viewed from top, and wherein the second voltage line may overlap with a boundary between the first sub-pixel and the second sub-pixel when viewed from the top.

The first voltage line may be a high-level voltage line, and the second voltage line may be a low-level voltage line.

The first voltage line may overlap with the second electrode located on the opposite side in the second direction of the first sub-pixel.

The second voltage line may overlap with the first electrode located on the one side in the second direction of the first sub-pixel.

According to one or more embodiments of the present disclosure, a method of fabricating a display device, the method includes preparing a substrate, wherein a plurality of pixels is on the substrate, each of the plurality of pixels comprising a first sub-pixel, a second sub-pixel adjacent to the first sub-pixel, and a third sub-pixel spaced from the first sub-pixel with the second sub-pixel therebetween, wherein first electrodes and second electrodes are on the substrate and located in the sub-pixels, wherein in the first sub-pixel, the first electrodes are extended in a first direction and are spaced from one another in a second direction crossing the first direction, the second electrodes are extended in the first direction and are spaced from one another with the first electrode located on an opposite side in the second direction therebetween, wherein in the second sub-pixel, the first electrodes are extended in the first direction and are spaced from one another in the second direction, the second electrodes are extended in the first direction and are spaced from one another with the first electrode located on one side in the second direction therebetween, and wherein in the third sub-pixel, the first electrodes are extended in the first direction and are spaced from one another in the second direction, the second electrodes are extended in the first direction and are spaced from one another with the first electrode located on the opposite side in the second direction therebetween, disposing light-emitting elements in one pixel of the plurality of pixels, and disposing light-emitting elements in another pixel adjacent to the one pixel in the second direction from among the plurality of pixels, wherein the disposing the light-emitting elements in the one pixel comprises applying a first voltage to the second electrodes of the first sub-pixel, the second electrodes of the second sub-pixel, and the second electrodes of the third sub-pixel of the one pixel, and applying a second voltage to the first electrodes of the first sub-pixel, the first electrodes of the second sub-pixel, and the first electrodes of the third sub-pixel of the one pixel, the second voltage being smaller than the first voltage.

The disposing the light-emitting elements in the another pixel may comprise applying the second voltage to the second electrodes of the first sub-pixel, the second electrodes of the second sub-pixel, and the second electrodes of the third sub-pixel of the another pixel, and applying the first voltage to the first electrodes of the first sub-pixel, the first electrodes of the second sub-pixel, and the first electrodes of the third sub-pixel of the another pixel.

The preparing the target substrate may comprise disposing a first voltage line and a second voltage line between the substrate and the first electrodes, and between the substrate the second electrodes, wherein the first voltage line may overlap with the second electrode located on the opposite side in the second direction of the first sub-pixel, and wherein the second voltage line may overlap with the first electrode located on the one side in the second direction of the first sub-pixel.

Each of the light-emitting elements of the one pixel and the light-emitting elements of the another pixel may comprise a first end and a second end opposite to the first end, and wherein the first end of each of the light-emitting elements of the one pixel and the first end of each of the light-emitting elements of the another pixel may face a same side in the second direction.

According to an embodiment of the disclosure, a display device includes electrodes disposed across different pixels and can improve the brightness while reducing dark spots.

It should be noted that effects of the disclosure are not limited to those described above and other effects of the disclosure will be apparent to those skilled in the art from the following descriptions.

BRIEF DESCRIPTION OF THE DRAWINGS

The above and other aspects and features of the present disclosure will become more apparent by describing in detail embodiments thereof with reference to the attached drawings, in which.

DETAILED DESCRIPTION

The present disclosure will now be described more fully hereinafter with reference to the accompanying drawings, in which embodiments of the present disclosure are shown. This disclosure may, however, be embodied in different forms and should not be construed as limited to the embodiments set forth herein. Rather, these embodiments are provided so that this disclosure will be thorough and complete, and will fully convey the scope of the present disclosure to those skilled in the art.

It will also be understood that when a layer is referred to as being "on" another layer or substrate, it can be directly on the other layer or substrate, or intervening layers may also be present. The same reference numbers indicate the same components throughout the specification.

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the present disclosure. Similarly, the second element could also be termed the first element.

Hereinafter, embodiments will be described with reference to the accompanying drawings.

Figure 1:
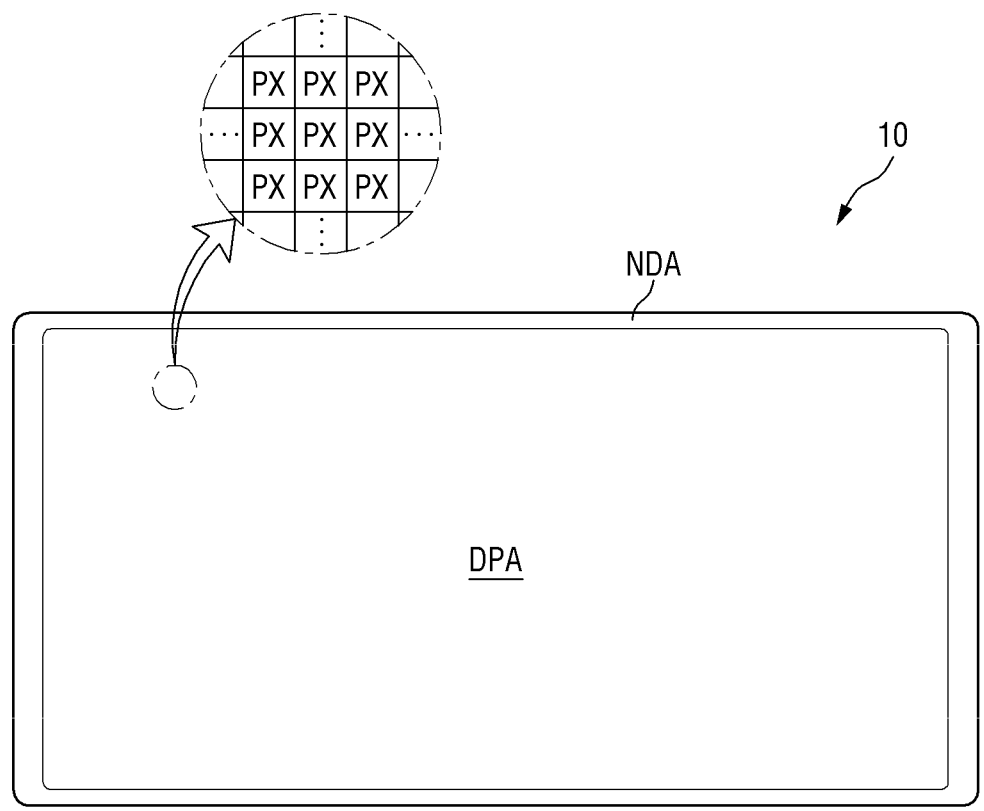
FIG. 1 is a plan view of a display device according to one or more embodiments of the present disclosure.

FIG. 1 is a plan view of a display device according to one or more embodiments of the present disclosure.

Referring to FIG. 1, the display device 10 displays a moving image or a still image. A display device 10 may refer to any electronic device that provides a display screen. For example, the display device 10 may include a television set, a laptop computer, a monitor, an electronic billboard, the Internet of Things devices, a mobile phone, a smart phone, a tablet personal computer (PC), an electronic watch, a smart watch, a watch phone, a head-mounted display device, a mobile communications terminal, an electronic notebook, an electronic book, a portable multimedia player (PMP), a navigation device, a game console and a digital camera, a camcorder, etc.

The display device 10 includes a display panel for providing a display screen. Examples of the display panel may include an inorganic light-emitting diode display panel, an organic light-emitting display panel, a quantum-dot light-emitting display panel, a plasma display panel, a field emission display panel, etc. In the following description, an inorganic light-emitting diode display panel is employed as an example of the display panel 10, but the present disclosure is not limited thereto. Any other display panel may be employed as long as the technical idea of the present disclosure can be equally applied.

The shape of the display device 10 may be modified in a variety of ways. For example, the display device 10 may have shapes such as a rectangle with longer lateral sides, a rectangle with longer vertical sides, a square, a quadrangle with rounded corners (vertices), other polygons, a circle, etc. The shape of a display area DPA of the display device 10 may also be similar to the overall shape of the display device 10. In the example shown in FIG. 1, the display device 10 has a rectangular shape with the longer sides in a second direction DR2.

The display device 10 may include a display area DPA and a non-display area NDA around an edge or periphery of the display area DPA. In the display area DPA, images can be displayed. In the non-display area NDA, no images are displayed. The display area DPA may be referred to as an active area, while the non-display area NDA may also be referred to as an inactive area. The display area DPA may generally occupy the majority of the center (or the central region) of the display device 10.

The display area DPA may include a plurality of pixels PX. The plurality of pixels PX may be arranged in a matrix. For example, the plurality of pixels PX may be arranged along rows and columns of a matrix. The shape of each pixel PX may be, but is not limited to, a rectangle or a square when viewed from the top. Each pixel may have a diamond shape having sides inclined with respect to a direction. The pixels PX may be arranged in stripes, in a pattern of islands, or a PENTILE® arrangement structure, but the present disclosure is not limited thereto. The PENTILE® arrangement structure may be referred to as an RGBG matrix structure (e.g., a PENTILE® matrix structure or an RGBG structure (e.g., a PENTILE® structure)). PENTILE® is a registered trademark of Samsung Display Co., Ltd., Republic of Korea. Each of the pixels PX may include at least one light-emitting element that emits light of a particular wavelength band of a color.

The non-display area NDA may be disposed around the display area DPA. The non-display area NDA may surround the display area DPA entirely or partially. The display area DPA may have a rectangular shape, and the non-display area NDA may be disposed to be adjacent to the four sides of the display area DPA. The non-display area NDA may form the bezel of the display device 10. Lines or circuit drivers included in the display device 10 may be disposed in each of the non-display area NDA, or external devices may be mounted.

Figure 2:
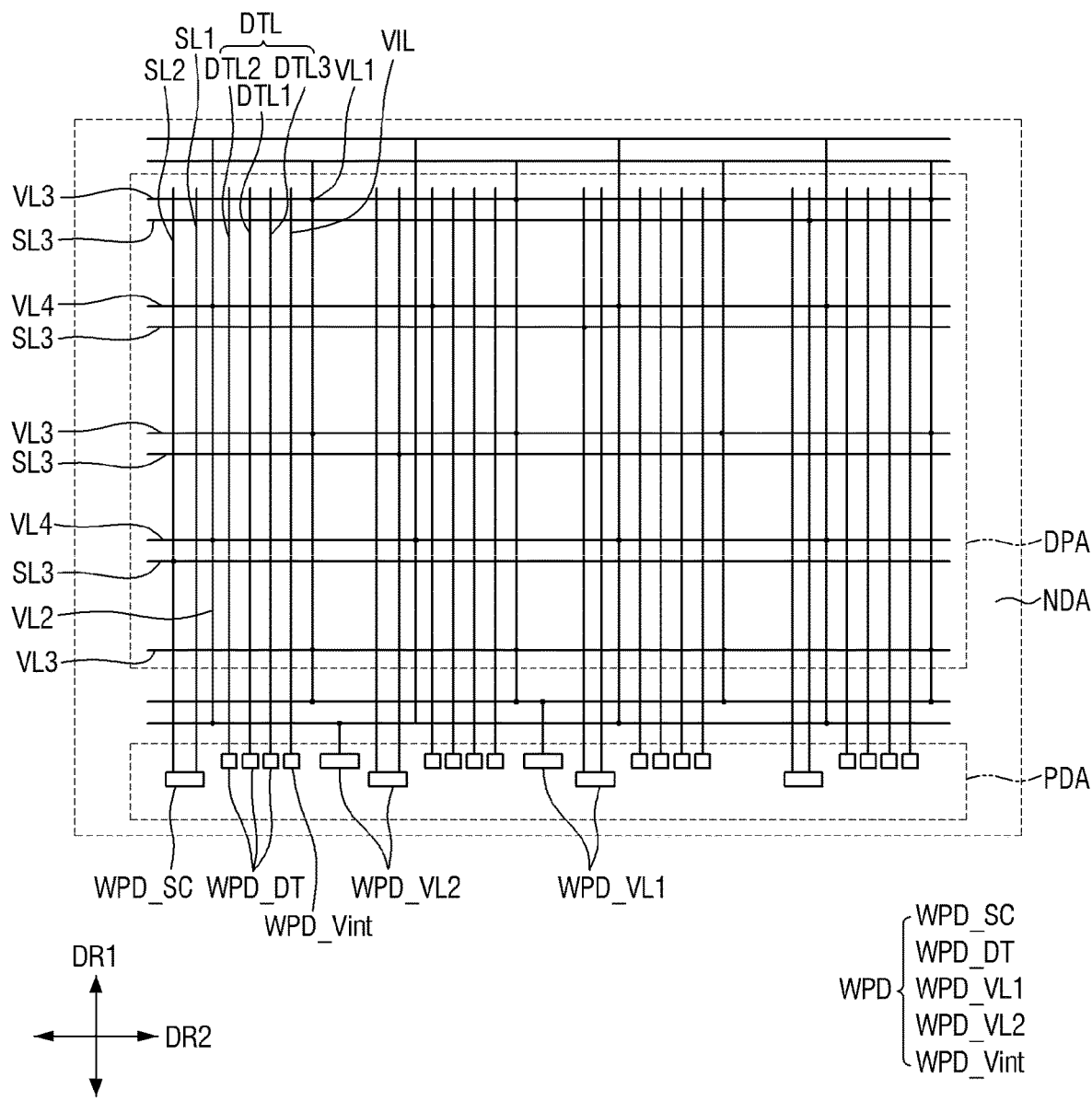
FIG. 2 is a plan view showing arrangements of lines of a display device according to one or more embodiments of the present disclosure.

FIG. 2 is a view schematically showing arrangements of lines in a display device according to one or more embodiments of the present disclosure.

Referring to FIG. 2, the display device 10 may include a plurality of lines. The display device 10 may include a plurality of scan lines SL: SL1, SL2, and SL3, a plurality of data lines DTL: DTL1, DTL2, and DTL3, an initialization voltage line VIL, and a plurality of voltage lines VL: VL1, VL2, VL3, and VL4. Also, other lines may be further disposed in the display device 10. The plurality of lines may include lines formed of a first conductive layer and extended in the first direction DR1, and lines formed of a third conductive layer and extended in the second direction DR2. It is, however, to be understood that the lines may be extended in other directions.

The first scan line SL1 and the second scan line SL2 may be extended in the first direction DR1. The first scan line SL1 and the second scan line SL2 may be disposed adjacent to each other, and may be spaced from other first and second scan lines SL1 and SL2 in the second direction DR2. The first scan line SL1 and the second scan line SL2 may be connected to a scan wire pad WPD_SC connected to a scan driver. The first scan line SL1 and the second scan line SL2 may be extended from a pad area PDA located in the non-display area NDA to the display area DPA.

The third scan line SL3 may be extended in the second direction DR2, and may be spaced from another third scan line SL3 in the first direction DR1. One third scan line SL3 may be connected to one or more first scan lines SL1 or one or more second scan lines SL2. The plurality of scan lines SL may have, but is not limited to, a mesh structure on the entire surface of the display area DPA.

As used herein, when an element is referred to as being "connected" or "coupled" to another element, it can be directly connected or coupled to the element or intervening elements may be present. In addition, such elements may be understood as a single integrated element with one portion thereof connected to another portion. Moreover, when an element is referred to as being "connected" to another element, it may be in direct contact with the element and also electrically connected to the element.

The data lines DTL may be extended in the first direction DR1. The data lines DTL may include a first data line DTL1, a second data line DTL2, and a third data line DTL3. The first to third data lines DTL1, DTL2, and DTL3 are disposed adjacent to one another as a group. The data lines DTL1, DTL2, and DTL3 may be extended from the pad area PDA located in the non-display area NDA to the display area DPA. It should be understood, however, that the disclosure is not limited thereto. The data lines DTL may be equally spaced from one another, and also spaced from a first voltage line VL1 and a second voltage line VL2 to be described later.

The initialization voltage line VIL may be extended in the first direction DR1. The initialization voltage line VIL may be disposed between the data lines DTL and the first voltage line VL1. The initialization voltage line VIL may be extended from the pad area PDA located in the non-display area NDA to the display area DPA.

The first voltage line VL1 and the second voltage line VL2 may be extended in the first direction DR1, and the third voltage line VL3 and the fourth voltage line VL4 may be extended in the second direction DR2. The first voltage line VL1 and the second voltage line VL2 may be arranged alternately along the second direction DR2, and the third voltage line VL3 and the fourth voltage line VL4 may be arranged alternately along the first direction DR1. The first voltage lines VL1 and the second voltage lines VL2 may be extended in the first direction DR1 and may traverse the display area DPA. Some of the third voltage line VL3 and the fourth voltage lines VL4 may be disposed in the display area DPA while the others may be disposed in the non-display area NDA located on the both sides of the display area DPA in the first direction DR1. The first voltage line VL1 and the second voltage line VL2 may be formed of a first conductive layer, and the third voltage line VL3 and the fourth voltage line VL4 may be formed of a third conductive layer that is different from the first conductive layer. The first voltage line VL1 may be connected to at least one third voltage line VL3, and the second voltage line VL2 may be connected to at least one fourth voltage line VL4. The plurality of voltage lines VL may have a mesh structure in the entirely display area DPA. It is, however, to be understood that the present disclosure is not limited thereto.

The first scan lines SL1, the second scan lines SL2, the data lines DTL, the initialization voltage line VIL, the first voltage lines VL1, and the second voltage lines VL2 may be electrically connected to at least one wire pad WPD. The wire pads WPD may be disposed in the non-display areas NDA. According to one or more embodiments of the present disclosure, the wire pads WPD may be disposed in the pad area PDA located on the lower side of the display area DPA that is the opposite in the first direction DR1. The first and second scan lines SL1 and SL2 may be connected to the scan wire pad WPD_SC disposed in the pad area PDA, and the data lines DTL may be connected to different data wire pads WPD_DT, respectively. The initialization voltage line VIL may be connected to the initialization wiring pad WPD_Vint, the first voltage line VL1 may be connected to a first voltage wire pad WPD_VL1, and the second voltage line VL2 may be connected to the second voltage wire pad WPD_VL2. External devices may be mounted on the wire pads WPD. External devices may be mounted on the wire pads WPD by an anisotropic conductive film, ultrasonic bonding, etc. Although the wire pads WPD are disposed in the pad area PDA located on the lower side of the display area DPA in the drawings, the present disclosure is not limited thereto. Some of the plurality of wire pads WPD may be disposed on the upper side or on one of the left and right sides of the display area DPA.

Each of the pixels PX or sub-pixels SPXn of the display device 10 includes a pixel driving circuit, where n is an integer equal to 1, 2, or 3. The above-described lines may pass through each of the pixels PX or the periphery thereof to apply a driving signal to the pixel driving circuit. The pixel driving circuit may include a transistor and a capacitor. The numbers of transistors and capacitors of each pixel driving circuit may be changed in a variety of ways. According to one or more embodiments of the present disclosure, each of the sub-pixels SPXn of the display device 10 may have a 3T1C structure, i.e., a pixel driving circuit includes three transistors and one capacitor. In the following description, the pixel driving circuit having the 3T1C structure will be described as an example. It is, however, to be understood that the present disclosure is not limited thereto. A variety of modified structure may be employed such as a 2T1C structure, a 7T1C structure and a 6T1C structure.

Figure 3:
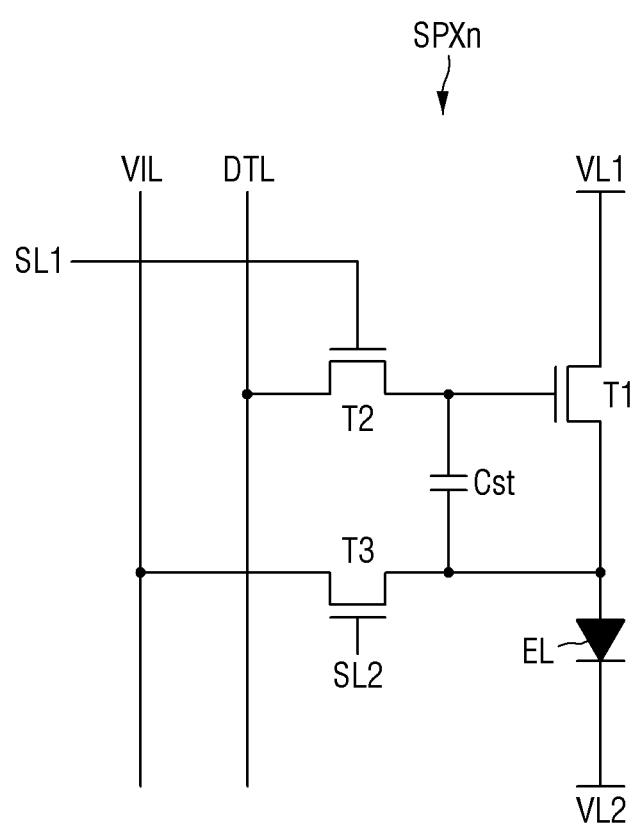
FIGS. 3 and 4 are pixel circuit diagrams of a display device according to one or more embodiments.
Figure 4:
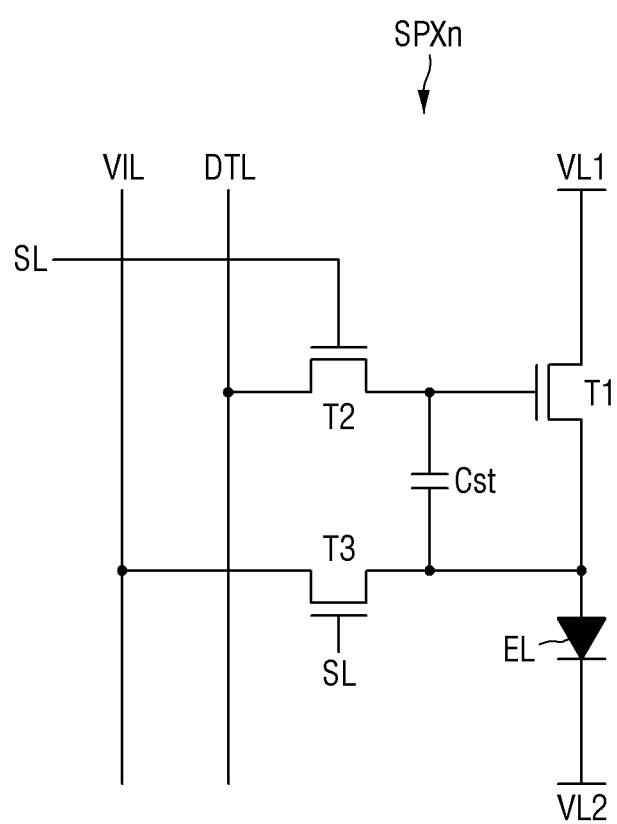

FIGS. 3 and 4 are pixel circuit diagrams of a display device according to one or more embodiments.

Referring to FIG. 3, each of the sub-pixels SPXn of the display device 10 according to one or more embodiments includes three transistors T1, T2, and T3 and one storage capacitor Cst in addition to a light-emitting diode EL.

The light-emitting diode EL emits light in proportional to the current supplied through the first transistor T1. The light-emitting diode EL includes a first electrode, a second electrode, and at least one light-emitting element disposed therebetween. The light-emitting element may emit light in a particular wavelength range by an electric signal transmitted from the first electrode and the second electrode.

A first end of the light-emitting diode EL may be connected to a source electrode of the first transistor T1, and a second end thereof may be connected to a second voltage line VL2 from which a low-level voltage (hereinafter referred to as a second supply voltage) lower than a high-level voltage (hereinafter referred to as a first supply voltage) of a first voltage line VL1 is applied.

The first transistor T1 adjusts a current flowing from the first voltage line VL1 from which the first supply voltage is supplied to the light-emitting diode EL according to the voltage difference between a gate electrode and the source electrode of the first transistor T1. For example, the first transistor T1 may be a driving transistor for driving the light-emitting diode EL. The gate electrode of the first transistor T1 may be connected to a source electrode of the second transistor T2, the source electrode thereof may be connected to the first electrode of the light-emitting diode EL, and the drain electrode thereof may be connected to the first voltage line VL1 from which the first supply voltage is applied.

The second transistor T2 is turned on by a scan signal of the first scan line SL1 to connect the data line DTL with the gate electrode of the first transistor T1. The gate electrode of the second transistor T2 may be connected to the first scan line SL1, the source electrode thereof may be connected to the gate electrode of the first transistor T1, and the drain electrode thereof may be connected to the data line DTL.

A third transistor T3 may be turned on by a scan signal of a second scan line SL2 to connect the initialization voltage line VIL with the first end of the light-emitting diode EL. The gate electrode of the third transistor T3 may be connected to the second scan line SL2, the drain electrode thereof may be connected to the initialization voltage line VIL, and the source electrode thereof may be connected to one end of the light-emitting diode EL or the source electrode of the first transistor T1.

The source electrode and the drain electrode of each of the transistors T1, T2, and T3 are not limited to those described above. They may be connected in the opposite way. Each of the transistors T1, T2, and T3 may be formed as a thin-film transistor (TFT). Although each of the transistors T1, T2, and T3 implemented as an n-type metal oxide semiconductor field effect transistor (MOSFET) in the example shown in FIG. 3, the present disclosure is not limited thereto. That is to say, each of the transistors T1, T2, and T3 may be implemented as a p-type MOSFET, or some of the transistors T1, T2, and T3 may be implemented as n-type MOSFETs while the others may be implemented as p-type MOSFETs.

The storage capacitor Cst is formed between the gate electrode and the source electrode of the first transistor T1. The storage capacitor Cst stores a voltage difference between the gate voltage and the source voltage of the first transistor T1.

According to the embodiment of FIG. 3, the gate electrode of the second transistor T2 may be connected to the first scan line SL1, and the gate electrode of the third transistor T3 may be connected to the second scan line SL2. The first scan line SL1 and the second scan line SL2 may be different scan lines, and the second transistor T2 and the third transistor T3 may be turned on in response to scan signals applied from different scan lines. It is, however, to be understood that the present disclosure is not limited thereto.

Referring to FIG. 4, the gate electrodes of the second transistor T2 and the third transistor T3 may be connected to the same scan line SL. The second transistor T2 and the third transistor T3 may be concurrently (e.g., simultaneously) turned on by a scan signal applied from the same scan line.

Hereinafter, the structure of one pixel PX of the display device 10 according to one or more embodiments will be described in detail with reference to other drawings.

Figure 5:
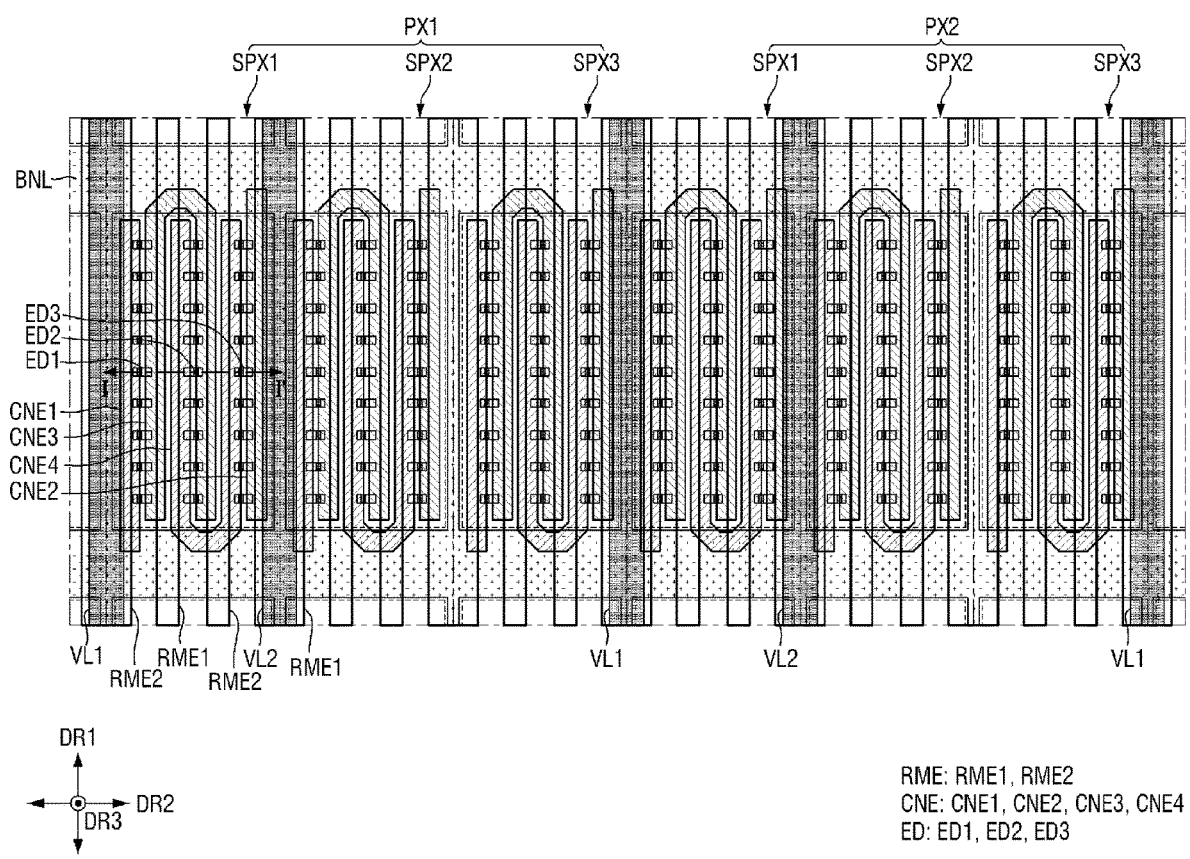
FIG. 5 is a plan view showing pixels of a display device according to one or more embodiments of the present disclosure.
Figure 6:
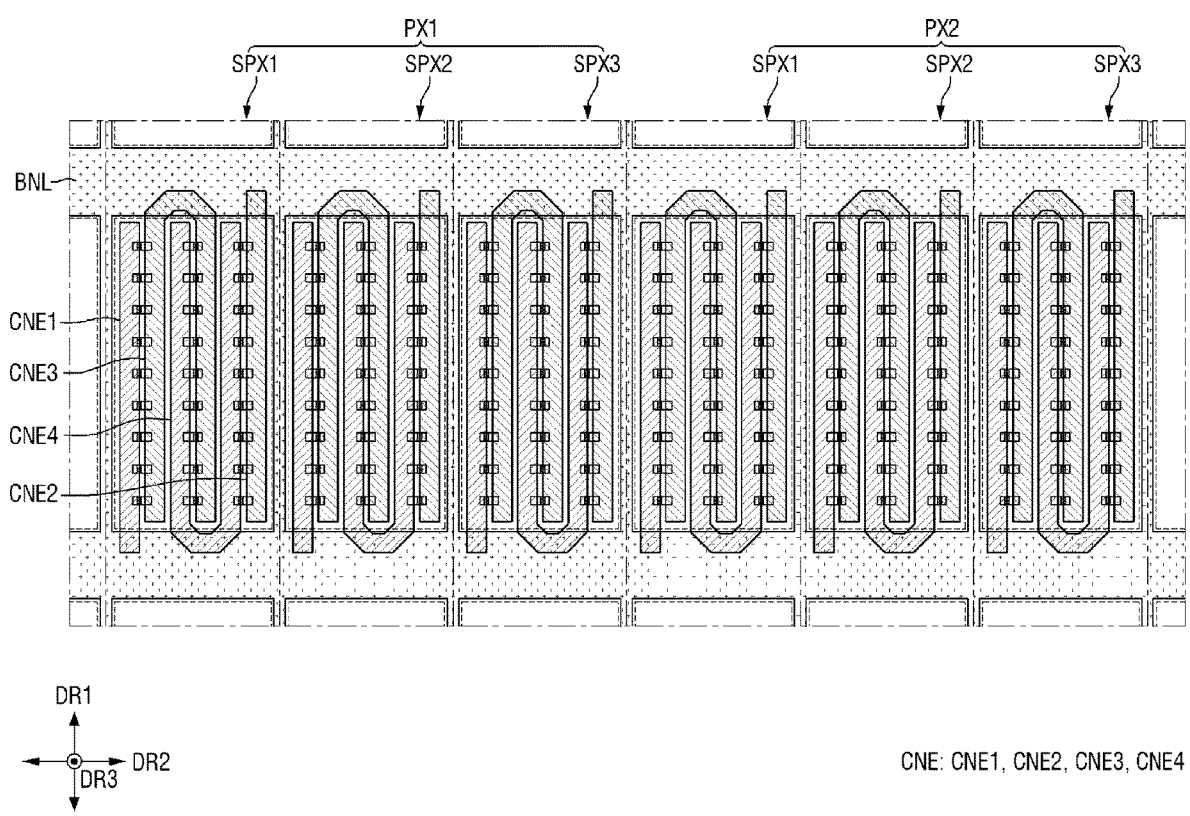
FIG. 6 is a plan view showing the connection electrodes and the light-emitting elements of FIG. 5.
Figure 7:
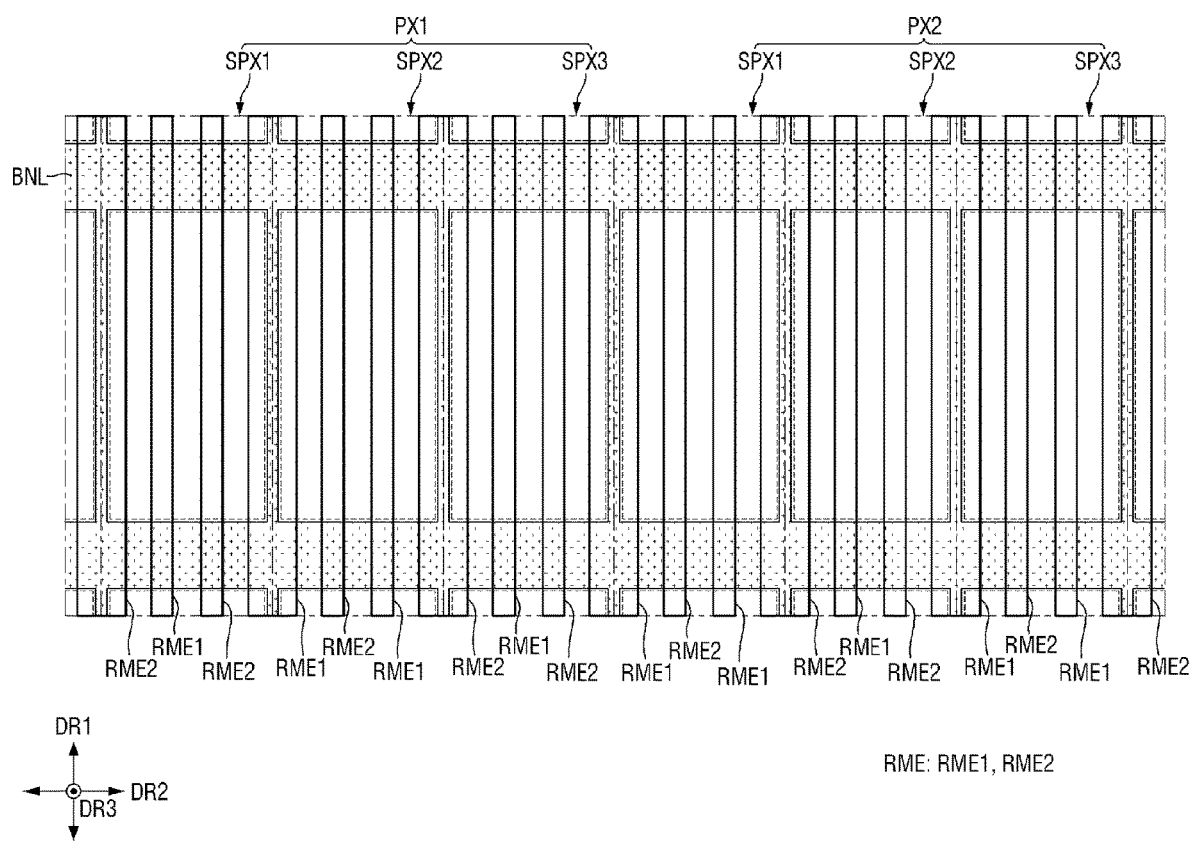
FIG. 7 is a plan view showing the first electrodes and the second electrodes of FIG. 5.
Figure 8:
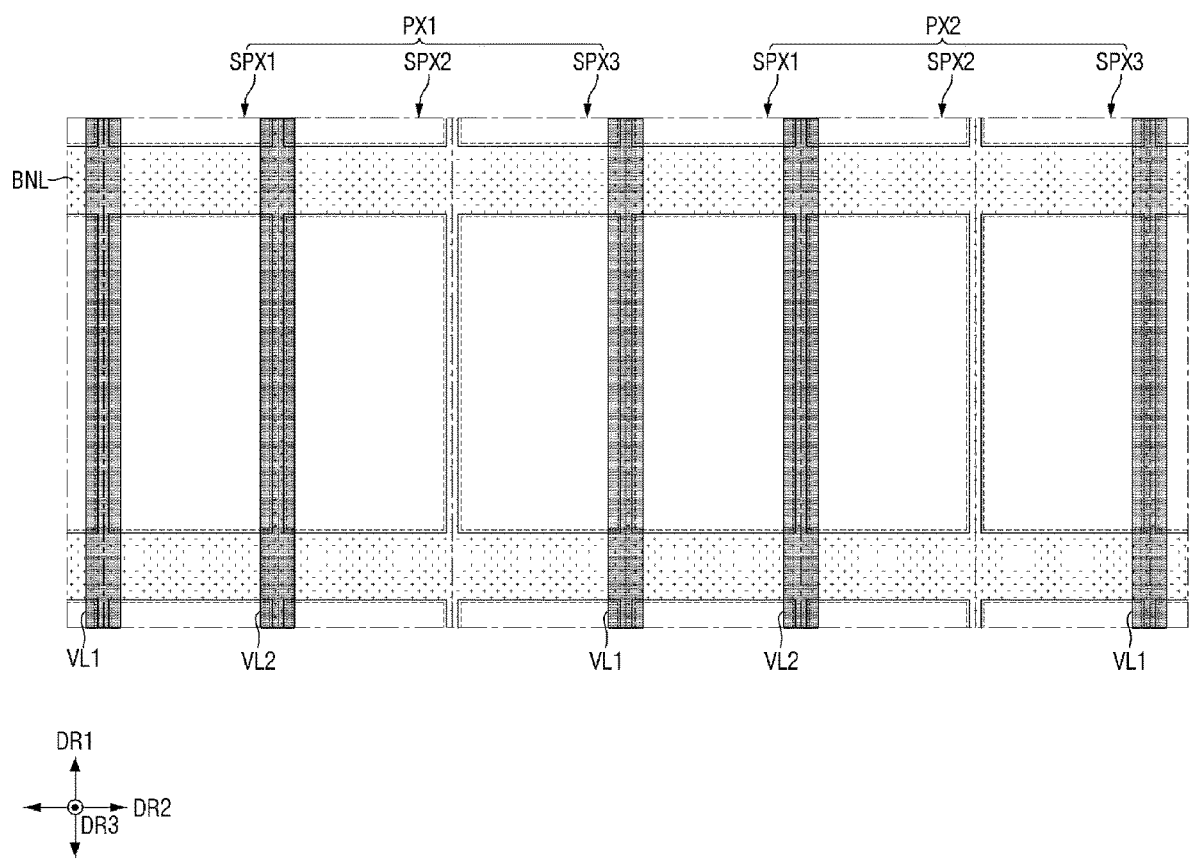
FIG. 8 is a plan view showing first voltage lines and second voltage lines of FIG. 5.

FIG. 5 is a plan view showing pixels of a display device according to one or more embodiments of the present disclosure. FIG. 6 is a plan view showing the connection electrodes and the light-emitting elements of FIG. 5. FIG. 7 is a plan view showing the first electrodes and the second electrodes of FIG. 5. FIG. 8 is a plan view showing first voltage lines and second voltage lines of FIG. 5.

FIG. 5 shows arrangements of electrodes RME: RME1 and RME2, a bank layer BNL, a plurality of light-emitting elements ED: ED1, ED2, and ED3, and connection electrodes CNE: CNE1, CNE2, CNE3 and CNE4 disposed in a pixel PX of a display device 10 when viewed from the top. FIG. 6 shows arrangements of the connection electrodes CNE: CNE1, CNE2, CNE3, and CNE4 and the light-emitting elements ED: ED1, ED2, and ED3 on the bank layer BNL of the pixels PX shown in FIG. 5; FIG. 7 shows arrangements of the electrodes RME: RME1 and RME2 on the bank layer BNL of the pixels PX shown in FIG. 5; and FIG. 8 shows arrangements of the voltage lines VL1 and VL2 on the bank layer BNL of the pixels PX shown in FIG. 5.

Referring to FIGS. 5 to 8, each of the pixels PX of the display device 10 may include a plurality of sub-pixels SPXn. For example, a pixel PX may include a first sub-pixel SPX1, a second sub-pixel SPX2, and a third sub-pixel SPX3. The first sub-pixel SPX1 may emit light of a first color, the second sub-pixel SPX2 may emit light of a second color, and the third sub-pixel SPX3 may emit light of a third color. For example, the first color may be blue, the second color may be green, and the third color may be red. It is, however, to be understood that the present disclosure is not limited thereto. All the sub-pixels SPXn may emit light of the same color. According to one or more embodiments of the present disclosure, the sub-pixels SPXn may emit blue light. Although the single pixel PX includes three sub-pixels SPXn in the example shown in the drawings, the present disclosure is not limited thereto. The pixel PX may include more than three sub-pixels SPXn.

Each of the sub-pixels SPXn of the display device 10 may include an emission area and a non-emission area. In the emission area, light-emitting elements ED are disposed so that light of a particular wavelength band may be output therefrom. In the non-emission area, the light-emitting elements ED are not disposed and the lights emitted from the light-emitting elements ED do not reach, and thus no light exits therefrom.

The emission area may include an area in which the light-emitting elements ED are disposed, as well as an area adjacent to the light-emitting elements ED where lights emitted from the light-emitting elements ED exit. For example, the emission area may also include an area in which lights emitted from the light-emitting elements ED are reflected or refracted by other elements to exit. The plurality of light-emitting elements ED may be disposed in each of the sub-pixels SPXn, and the emission area may include the area where the light-emitting elements are disposed and the adjacent area.

Although the emission areas of the sub-pixels SPXn have the uniform area in the example shown in the drawings, the present disclosure is not limited thereto. In one or more embodiments, the emission areas of the sub-pixels SPXn may have different areas depending on the colors or wavelength bands of lights emitted from the light-emitting elements ED disposed in the sub-pixels.

The display device 10 according to the described embodiment may include a plurality of electrodes RME: RME1 and RME2, bank patterns BP1 and BP2 (see FIG. 9), a bank layer BNL, light-emitting elements ED, and connection electrodes CNE: CNE1, CNE2, CNE3, and CNE4.

The bank patterns BP1 and BP2 may be disposed in the emission area EMA of each sub-pixel SPXn.

Figure 9:
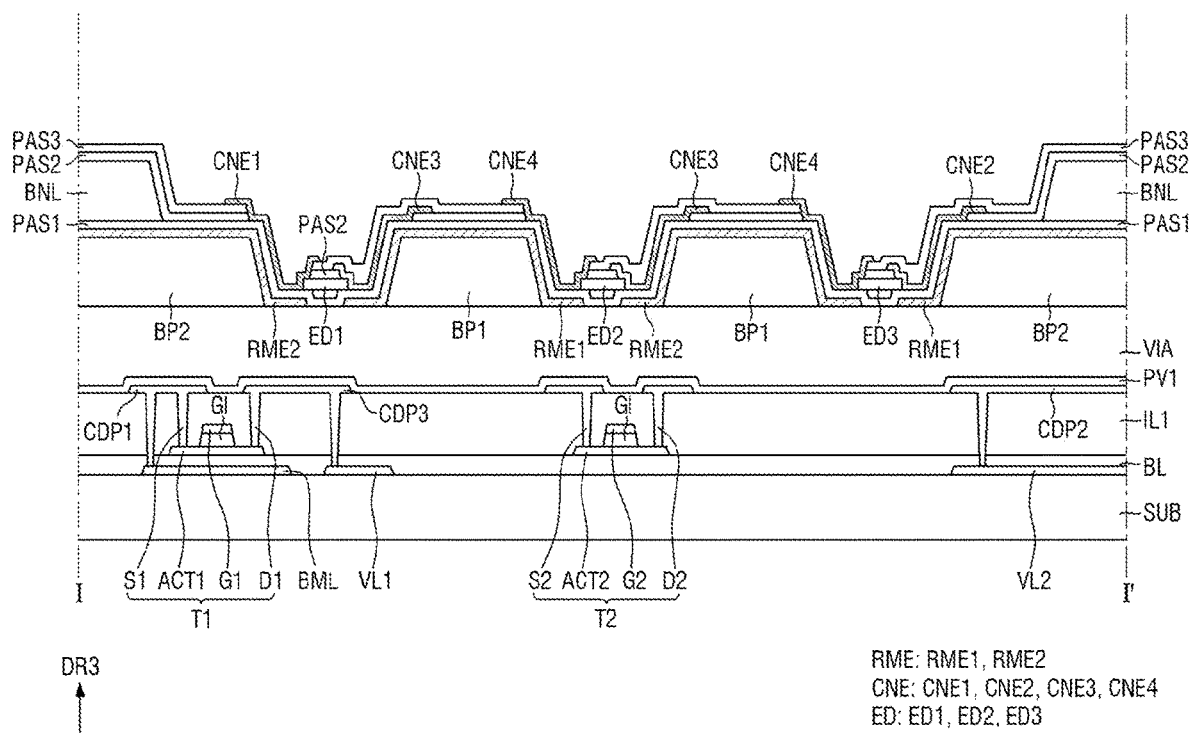
FIG. 9 is a cross-sectional view taken along the line I-I' in FIG. 5.

For example, as shown in FIG. 9, the bank patterns BP1 and BP2 may include first bank patterns BP1 and second bank patterns BP2 spaced from each other in the second direction DR2 in the emission area EMA of each sub-pixel SPXn. The first bank patterns BP1 may be disposed at the center of the emission area EMA such that they are spaced from each other, and the second bank patterns BP2 may be spaced from the first bank patterns BP1 disposed therebetween. The first bank patterns BP1 and the second bank patterns BP2 may be arranged alternately along the second direction DR2. A plurality of light-emitting elements ED may be disposed between the first bank patterns BP1 and the second bank patterns BP2.

The electrodes RME: RME1 and RME2 have a shape extended in one direction and are disposed in each of the sub-pixels SPXn. The plurality of electrodes RME1 and RME2 may be extended in the first direction DR1 to be disposed in the emission area of the sub-pixel SPXn, and they may be spaced from one another along the second direction DR2. The plurality of electrodes RME may be electrically connected to the light-emitting elements ED. It should be understood, however, that the present disclosure is not limited thereto. The electrodes RME may not be electrically connected to the light-emitting elements ED.

The display device 10 may include first electrodes RME1 and second electrodes RME2 disposed in the sub-pixels SPXn.

The plurality of pixels PX may include first pixels PX1 and second pixels PX2 adjacent to one side of the first pixels PX1 in the second direction DR2.

Initially, the first pixels PX1 will be described.

In the first sub-pixel SPX1, the first electrodes RME1 may be extended in the first direction DR1 and may be spaced from one another in a second direction DR2 intersecting the first direction DR1, and the second electrodes RME2 may be extended in the first direction DR1 and may be spaced from one another with the first electrode RME1 located on the opposite side in the second direction DR2 therebetween.

In the second sub-pixel SPX2, the first electrodes RME1 may be extended in the first direction DR1 and may be spaced from one another in the second direction DR2, and the second electrodes RME2 may be extended in the first direction DR1 and may be spaced from one another with the first electrode RME1 located on one side in the second direction DR2 therebetween.

In the first sub-pixel SPX1, the first electrode RME1 located on the one side in the second direction DR2 may be identical to the first electrode RME1 located on the opposite side in the second direction DR2 in the second sub-pixel SPX2. In other words, the first sub-pixel SPX1 and the second sub-pixel SPX2 may share one first electrode RME1.

In the third sub-pixel SPX3, the first electrodes RME1 may be extended in the first direction DR1 and may be spaced from one another in the second direction DR2, and the second electrodes RME2 may be extended in the first direction DR1 and may be spaced from one another with the first electrode RME1 located on the opposite side in the second direction DR2 therebetween.

In the third sub-pixel SPX3, the first electrode RME1 located on the one side in the second direction DR2 may be the same as the first electrode RME1 located on the opposite side in the second direction DR2 in the first sub-pixel SPX1 of the second pixel PX2. In other words, the third sub-pixel SPX3 of the first pixel PX1 and the first sub-pixel SPX1 of the second pixel PX2 may share one first electrode RME1.

In the first sub-pixel SPX1, first light-emitting elements ED1 may be disposed between the first electrode RME1 located on the opposite side in the second direction DR2 and the second electrode RME2 located on the opposite side in the second direction DR2, second light-emitting elements ED2 may be disposed between the first electrode RME1 located on the opposite side in the second direction DR2 and the second electrode RME2 located on the one side in the second direction DR2, and third light-emitting elements ED3 may be disposed between the first electrode RME1 located on the one side in the second direction DR2 and the second electrode RME2 located on the one side in the second direction DR2.

First ends of the first light-emitting elements ED1 and first ends of the third light-emitting elements ED3 may face the opposite side in the second direction DR2, whereas first ends of the second light-emitting elements ED2 may face the one side opposed to the opposite side in the second direction DR2.

In the second sub-pixel SPX2, first light-emitting elements ED1 may be disposed between the first electrode RME1 located on the opposite side in the second direction DR2 and the second electrode RME2 located on the opposite side in the second direction DR2, second light-emitting elements ED2 may be disposed between the second electrode RME2 located on the opposite side in the second direction DR2 and the first electrode RME1 located on the one side in the second direction DR2, and third light-emitting elements ED3 may be disposed between the first electrode RME1 located on the one side in the second direction DR2 and the second electrode RME2 located on the one side in the second direction DR2.

Figure 10:
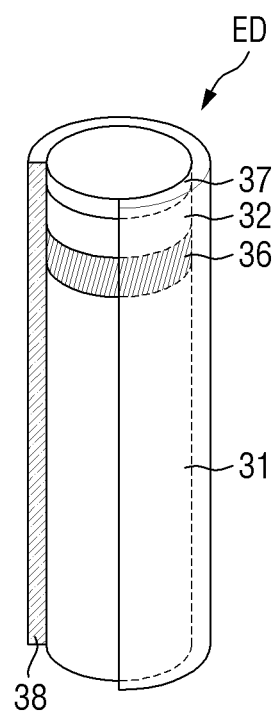
FIG. 10 is a schematic cutaway view showing a light-emitting element according to one or more embodiments of the present disclosure.

In the second sub-pixel SPX2, the first ends of the first light-emitting elements ED1 and the first ends of the third light-emitting elements ED3 may face the one side in the second direction DR2, whereas the first ends of the second light-emitting elements ED2 may face the opposite side in the second direction DR2. Herein, the first end of each of the light-emitting elements ED1, ED2, and ED3 may refer to the end at which a second semiconductor layer 32 of the light-emitting element ED of FIG. 10 is located. On the other hand, the second end opposite to the first end may refer to the end at which a first semiconductor layer 31 is located.

In the third sub-pixel SPX3, first light-emitting elements ED1 may be disposed between the first electrode RME1 located on the opposite side in the second direction DR2 and the second electrode RME2 located on the opposite side in the second direction DR2, second light-emitting elements ED2 may be disposed between the first electrode RME1 located on the opposite side in the second direction DR2 and the second electrode RME2 located on the one side in the second direction DR2, and third light-emitting elements ED3 may be disposed between the first electrode RME1 located on the one side in the second direction DR2 and the second electrode RME2 located on the one side in the second direction DR2.

In the third sub-pixel SPX3, the first ends of the first light-emitting elements ED1 and the first ends of the third light-emitting elements ED3 may face the opposite side in the second direction DR2, whereas the first ends of the second light-emitting elements ED2 may face the one side in the second direction DR2.

The first voltage line VL1 and the second voltage line VL2 may be further disposed between the first substrate SUB (see FIG. 9) and the first electrodes RME1, and between the first substrate SUB and the second electrodes RME2.

The first voltage line VL1 may overlap with the boundary between the first sub-pixel SPX1 and the third sub-pixel SPX3 when viewed from the top, and the second voltage line VL2 may overlap with the boundary between the first sub-pixel SPX1 and the second sub-pixel SPX2 when viewed from the top.

The first voltage line VL1 may be a high-level voltage line, and the second voltage line VL2 may be a low-level voltage line.

The first voltage line VL1 may overlap with the second electrode RME2 located on the opposite side of the first sub-pixel SPX1 in the second direction DR2.

The second voltage line VL2 may overlap with the first electrode RME1 located on the one side of the first sub-pixel SPX1 in the second direction DR2.

In the first sub-pixel SPX1, the first connection electrode CNE1 may be in contact with the first ends of the first light-emitting elements ED1, the second connection electrode CNE2 may be in contact with the second ends of the third light-emitting elements ED3, the third connection electrode CNE3 may be in contact with the second ends of the first light-emitting elements ED1 and the first ends of the second light-emitting elements ED2, and the fourth connection electrode CNE4 may be in contact with the second ends of the second light-emitting elements ED2 and the first ends of the third light-emitting elements ED3.

The first connection electrode CNE1 and the second connection electrode CNE2 may be extended along the first direction DR1 and may be spaced from each other along the second direction DR2.

The third connection electrode CNE3 and the fourth connection electrode CNE4 may be disposed between the first connection electrode CNE1 and the second connection electrode CNE2. The third connection electrode CNE3 may include first vertical portions extended in the first direction DR1 and spaced from one another, and a first connection portion connecting the first vertical portions to each other. The fourth connection electrode CNE4 may include second vertical portions extended in the first direction DR1 and spaced from one another, and a second connection portion connecting the second vertical portions to each other. The first vertical portion of the third connection electrode CNE3 located on the opposite side in the second direction DR2 may be disposed between the first connection electrode CNE1 and the second vertical portion of the fourth connection electrode CNE4 located on the opposite side in the second direction DR2. The first vertical portion of the third connection electrode CNE3 located on the one side in the second direction DR2 may be disposed between the second vertical portions of the fourth connection electrode CNE4 that are spaced from each other. The second vertical portion of the fourth connection electrode CNE4 located on the one side in the second direction DR2 may be disposed between the second connection electrode CNE2 and the first vertical portion of the third connection electrode CNE3 located on the one side in the second direction DR2. The arrangement of the connection electrodes CNE1 to CNE4 may be the same in different sub-pixels SPX1, SPX2 and SPX3.

In the second sub-pixel SPX2, the first connection electrode CNE1 may be in contact with the second ends of the first light-emitting elements ED1, the second connection electrode CNE2 may be in contact with the first ends of the third light-emitting elements ED3, the third connection electrode CNE3 may be in contact with the first ends of the first light-emitting elements ED1 and the second ends of the second light-emitting elements ED2, and the fourth connection electrode CNE4 may be in contact with the first ends of the second light-emitting elements ED2 and the second ends of the third light-emitting elements ED3.

In the third sub-pixel SPX3, the first connection electrode CNE1 may be in contact with the first ends of the first light-emitting elements ED1, the second connection electrode CNE2 may be in contact with the second ends of the third light-emitting elements ED3, the third connection electrode CNE3 may be in contact with the second ends of the first light-emitting elements ED1 and the first ends of the second light-emitting elements ED2, and the fourth connection electrode CNE4 may be in contact with the second ends of the second light-emitting elements ED2 and the first ends of the third light-emitting elements ED3.

In the display device 10 according to the described embodiment, three light-emitting elements ED1, ED2, and ED3 may be disposed in each of the sub-pixels SPX1, SPX2, and SPX3. Furthermore, in the emission area of each of the sub-pixels SPX1, SPX2, and SPX3, the connection electrodes CNE have the shape extended in the first direction DR1, so that the length of the area in which the three light-emitting elements ED1, ED2, and ED3 can be disposed can be increased. Furthermore, the four connection electrodes CNE1, CNE2, CNE3, and CNE4 may be disposed in each of the sub-pixels SPX1, SPX2, and SPX3 and thus the three light-emitting elements ED1, ED2, and ED3 may be disposed. In this manner, the brightness of the pixel PX can be improved.

Incidentally, as described above, the adjacent sub-pixels SPX1, SPX2, and SPX3 may share one electrode RME1 or RME2 in both of the pixels PX1 and PX2, and the arrangements of the electrodes RME1 and RME2 and the light-emitting elements ED1, ED2, and ED3 of the adjacent sub-pixels SPX1, SPX2, and SPX3 may have a symmetrical structure with respect to the boundaries between the adjacent sub-pixels SPX1, SPX2, and SPX3. In other words, the arrangements of the sub-pixels SPX1, SPX2, and SPX3 of the adjacent pixels PX1 and PX2 may be different.

On the contrary, the arrangements of the voltage lines VL1 and VL2 may be the same in both of the pixels PX1 and PX2. That is to say, the first voltage line VL1 may be located between the third sub-pixel SPX3 of the first pixel PX1 and the first sub-pixel SPX1 of the second pixel PX2, and the second voltage line VL2 may be located between the first sub-pixel SPX1 and the second sub-pixel SPX2 of each of the pixels PX1 and PX2. Specifically, the first voltage line VL1 may overlap with the second electrode RME2 located on the opposite side of the first sub-pixel SPX1 in the second direction DR2, and the second voltage line VL2 may overlap with the first electrode RME1 located on the one side of the first sub-pixel SPX in the second direction DR2.

In other words, because the arrangements of the sub-pixels SPX1, SPX2, and SPX3 are different whereas the arrangements of the voltage lines VL1 and VL2 are the same in the adjacent pixels PX1 and PX2, there may be an alignment error during the process of disposing (or aligning) the light-emitting elements ED in the first pixel PX1 and the second pixel PX2 concurrently (e.g., simultaneously). In this regard, according to the method of fabricating the display device according to the described embodiment, the light-emitting elements ED in the first pixel PX1 and the light-emitting elements ED in the second pixel PX2 are disposed with a time difference, and thus it is possible to prevent or reduce an alignment error. Detailed descriptions thereon will be given below with reference to FIGS. 11 and 12.

FIG. 9 is a cross-sectional view taken along the line I-I' in FIG. 5. FIG. 10 is a view showing a light-emitting element according to one or more embodiments of the present disclosure.

Referring to FIG. 9 in conjunction with FIGS. 5 to 8, the display device 10 may include a first substrate SUB, and a semiconductor layer, a plurality of conductive layers, and a plurality of insulating layers disposed thereon. In addition, the display device 10 may include a plurality of electrodes RME: RME1 and RME2, light-emitting elements ED: ED1, ED2, and ED3, and connection electrodes CNE: CNE1, CNE2, CNE3 and CNE4. The semiconductor layer, the conductive layers and the insulating layers may form a circuit layer of the display device 10.

The first substrate SUB may be an insulating substrate. The first substrate SUB may be made of an insulating material such as glass, quartz, and/or a polymer resin. The first substrate SUB may be either a rigid substrate or a flexible substrate that can be bent, folded, or rolled.

A first conductive layer may be disposed on the first substrate SUB. The first conductive layer may include a bottom metal layer BML, a first voltage line VL1, and a second voltage line VL2. The bottom metal layer BML may overlap a first active layer ACT1 of a first transistor T1 in a thickness direction of the substrate SUB (e.g., a third direction DR3). The bottom metal layer BML may prevent light from being incident on the first active layer ACT1 of the first transistor or may be electrically connected to the first active layer ACT1 to stabilize the electrical characteristics of the first transistor T1. It is, however, to be noted that the bottom metal layer BML may be eliminated.

A high-level voltage (or a first supply voltage) may be applied to the first voltage line VL1, and a low-level voltage (or a second supply voltage) may be applied to the second voltage line VL2. The first voltage line VL1 may be electrically connected to the first transistor T1 through a conductive pattern of the third conductive layer (e.g., a third conductive pattern CDP3). The second voltage line VL2 may be electrically connected to the second ends of the light-emitting elements EL through a conductive pattern of the third conductive layer (e.g., the second conductive pattern CDP2).

Although the first voltage line VL1 and the second voltage line VL2 are disposed on the first conductive layer in the example shown in the drawings, the present disclosure is not limited thereto.

A buffer layer BL may be disposed on the first conductive layer and the first substrate SUB. The buffer layer BL may be formed on the first substrate SUB to protect the transistors of the pixel PX from moisture permeating through the first substrate SUB that is susceptible to moisture permeation, and may also provide a flat surface.

The semiconductor layer is disposed on the buffer layer BL. The semiconductor layer may include the first active layer ACT1 of the first transistor T1 and the second active layer ACT2 of the second transistor T2. The first active layer ACT1 and the second active layer ACT2 may be disposed to partially overlap the first gate electrode G1 of the first transistor T1 and the second gate electrode G2 of the second transistor T2 of a second conductive layer, respectively, which will be described later, in the third direction DR3.

The semiconductor layer may include polycrystalline silicon, monocrystalline silicon, an oxide semiconductor, etc. In other embodiments, the semiconductor layer may include polycrystalline silicon. The oxide semiconductor may be an oxide semiconductor containing indium (In). For example, the oxide semiconductor may be at least one of indium tin oxide (ITO), indium zinc oxide (IZO), indium gallium oxide (IGO), indium zinc tin oxide (IZTO), indium gallium tin oxide (IGTO), indium gallium zinc oxide (IGZO), indium-gallium zinc tin oxide (IGZTO), etc.

Although only one first transistor T1 is disposed in the sub-pixel SPXn of the display device 10 in the drawing, the present disclosure is not limited thereto. A larger number of transistors may be included in the display device 10.

A first gate insulator GI is disposed on the semiconductor layer. The first gate insulator GI may work as a gate insulating film of the transistors T1 and T2. In the example shown in the drawings, the first gate insulator GI is patterned together with the gate electrodes G1 and G2 of the second conductive layer to be described later, and is partially disposed between the second conductive layer and the active layers ACT1 and ACT2 of the semiconductor layer. It should be understood, however, that the present disclosure is not limited thereto. In one or more embodiments, the first gate insulator GI may be disposed entirely on the buffer layer BL.

The second conductive layer is disposed on the first gate insulator GI. The second conductive layer may include a first gate electrode G1 of the first transistor T1, and a second gate electrode G2 of the second transistor T2. The first gate electrode G1 may overlap a channel region of the first active layer ACT1 in the third direction DR3, which is the thickness direction. The second gate electrode G2 may overlap a channel region of the second active layer ACT2 in the third direction DR3, which is the thickness direction. In one or more embodiments, the second conductive layer may further include an electrode of a storage capacitor.

A first interlayer dielectric layer IL1 is disposed on the second conductive layer as well as the buffer layer BL. The first interlayer dielectric layer IL1 may work as an insulating film between the second conductive layer and other layers disposed thereon and can protect the second conductive layer.

The third conductive layer is disposed on the first interlayer dielectric layer IL1. The third conductive layer may include a plurality of conductive patterns CDP1, CDP2, and CDP3, and source electrodes S1 and S2 and drain electrodes D1 and D2 of each of the transistors T1 and T2. Some of the conductive patterns CDP1, CDP2, and CDP3 may electrically connect conductive layers or semiconductor layers of different layers with one another and may work as source/drain electrodes of the transistors T1 and T2.

The first conductive pattern CDP1 may be in contact with the first active layer ACT1 of the first transistor T1 through a contact hole penetrating the first interlayer dielectric layer IL1. The first conductive pattern CDP1 may be in contact with the bottom metal layer BML through a contact hole penetrating the first interlayer dielectric layer IL1 and the buffer layer BL. The first conductive pattern CDP1 may work as a first source electrode S1 of the first transistor T1. In addition, the first conductive pattern CDP1 may be electrically connected to the first electrode RME1 or the first connection electrode CNE1.

The second conductive pattern CDP2 may be in contact with the second voltage line VL2 through a contact hole penetrating the first interlayer dielectric layer IL1 and the buffer layer BL.

The third conductive pattern CDP3 may be in contact with the first voltage line VL1 through a contact hole penetrating the first interlayer dielectric layer IL1 and the buffer layer BL. In addition, the third conductive pattern CDP3 may be in contact with the first active layer ACT1 of the first transistor T1 through a contact hole penetrating the first interlayer dielectric layer IL1. The third conductive pattern CDP3 may electrically connect the first voltage line VL1 with the first transistor T1 and may work as the first drain electrode D1 of the first transistor T1.

Each of the second source electrode S2 and the second drain electrode D2 may be in contact with the second active layer ACT2 of the second transistor T2 through contact holes penetrating the first interlayer dielectric layer IL1. The second transistor T2 may transmit a data signal to the first transistor T1 or may transmit an initialization signal.

A first passivation layer PV1 is disposed over the third conductive layer. The first passivation layer PV1 may work as an insulating film between the third conductive layer and other layers and can protect the third conductive layer.

The buffer layer BL, the first gate insulating layer GI, the first interlayer dielectric layer IL1, and the first passivation layer PV1 may be made up of multiple inorganic layers stacked on one another alternately. For example, the buffer layer BL, the first gate insulating layer GI, the first interlayer dielectric layer IL1, and the first passivation layer PV1 may be made up of a double layer in which inorganic layers including at least one of silicon oxide (SiOx), silicon nitride (SiNx), and silicon oxynitride (SiON) are stacked on one another or multiple layers in which they are alternately stacked on one another. It is, however, to be understood that the present disclosure is not limited thereto. The buffer layer BL, the first gate insulating layer GI, the first interlayer dielectric layer IL1, and the first passivation layer PV1 may be made up of a single inorganic layer including the above-described insulating material. In addition, in one or more embodiments, the first interlayer dielectric layer IL1 may be made of an organic insulating material such as polyimide (PI).

A via layer VIA is disposed on the third conductive layer and the first passivation layer PV1 in the display area DPA. The via layer VIA may include an organic insulating material, for example, an organic insulating material such as polyimide (PI), to provide a flat surface over the underlying conductive layers having different heights. It should be noted that the via layer VIA may be eliminated in some implementations.

The display device 10 may include the electrodes bank patterns BP1 and BP2, electrodes RME: RME1 and RME2, the bank layer BNL, the light-emitting elements ED, and the connection electrodes CNE: CNE1, CNE2, CNE3, and CNE4 as a display element layer disposed on the via layer VIA. In addition, the display device 10 may include insulating layers PAS1, PAS2, and PAS3 disposed on the via layer VIA.

The plurality of bank patterns BP1 and BP2 may be disposed on the via layer VIA. For example, the bank patterns BP1 and BP2 may be disposed directly on the via layer VIA, and may have a structure that at least partly protrudes from the upper surface of the via layer VIA. The protruding portions of the bank patterns BP1 and BP2 may have inclined side surfaces or bent side surfaces with a suitable curvature (e.g., a predetermined curvature). The lights emitted from the light-emitting elements ED may be reflected by the electrodes RME disposed on the bank patterns BP1 and BP2 so that the lights may exit toward the upper side of the via layer VIA. In one or more embodiments, unlike that shown in the drawings, the bank patterns BP1 and BP2 may have a shape with a bent outer surface with a suitable curvature (e.g., a predetermined curvature), for example, a semi-circular or semi-elliptical shape in the cross-sectional view. The bank patterns BP1 and BP2 may include, but is not limited to, an organic insulating material such as polyimide (PI).

The plurality of electrodes RME: RME1 and RME2 may be disposed on the bank patterns BP1 and BP2 and the via layer VIA. The first electrode RME1 and the second electrode RME2 may be disposed on at least inclined side surfaces of the bank patterns BP1 and BP2. For example, the width of the first electrodes RME1 and the second electrodes RME2 measured in the second direction DR2 may be greater than that of the first bank patterns BP1 and the second bank patterns BP2. The first electrodes RME1 and the second electrodes RME2 may cover the inclined side surfaces of the first bank patterns BP1 and the second bank patterns BP2. Although the second electrodes RME2 cover the side surface of the second bank patterns BP2 disposed in the emission area in the example shown in the drawings, the second electrodes RME2 may also cover the opposite side surface of the second bank patterns BP2 disposed in the emission area of another adjacent sub-pixel SPXn.

The light-emitting elements ED disposed between the bank patterns BP1 and BP2 or between the first bank patterns BP1 may emit lights through the both ends, and the emitted lights may travel toward the electrodes RME disposed on the bank patterns BP1 and BP2. The part of each of the electrodes RME that is disposed on the bank patterns BP1 and BP2 may reflect lights emitted from the light-emitting elements ED. The first electrodes RME1 and the second electrodes RME2 may be disposed to cover the side surfaces of the bank patterns BP1 and BP2 on at least one side to reflect lights emitted from the light-emitting elements ED.

Each of the electrodes RME may include a conductive material having a high reflectance. For example, the electrodes RME may include a metal such as silver (Ag), copper (Cu) and aluminum (Al), or may include an alloy including aluminum (Al), nickel (Ni), lanthanum (La), or the like, or a stack of a metal layer such as titanium (Ti), molybdenum (Mo) and niobium (Nb) and the alloy. In one or more embodiments, the electrodes RME may be made up of a double- or multi-layer in which an alloy containing aluminum (Al) and at least one metal layer made of titanium (Ti), molybdenum (Mo) and niobium (Nb) are stacked on one another.

It is, however, to be understood that the present disclosure is not limited thereto. The electrodes RME may further include a transparent conductive material. For example, each of the electrodes RME may include a material such as ITO, IZO, and ITZO. In one or more embodiments, each of the electrodes RME1 and RME2 may have a structure in which one or more layers of a transparent conductive material and one or more metal layers having high reflectivity are stacked on one another, or may be made up of a single layer including them. For example, each of the electrodes RME may have a stack structure such as ITO/Ag/ITO/, ITO/Ag/IZO, or ITO/Ag/ITZO/IZO. The electrodes RME may be electrically connected to the light-emitting elements ED and may reflect some of the lights emitted from the light-emitting elements ED toward the upper side of the first substrate SUB.

The first insulating layer PAS1 may be disposed on the via layer VIA and the plurality of electrodes RME. The first insulating layer PAS1 may include an insulating material, and can protect the plurality of electrodes RME and can insulate different electrodes RME from each other. As the first insulating layer PAS1 is disposed to cover the electrodes RME before the bank layer BNL is formed, it is possible to prevent the electrode RME from being damaged during the process of forming the bank layer BNL. In addition, the first insulating layer PAS1 can also prevent that the light-emitting diodes ED disposed thereon are brought into contact with other elements and damaged.

In one or more embodiments, the first insulating layer PAS1 may have steps so that a part of the upper surface is recessed between the electrodes RME that are spaced from one another in the second direction DR2. The light-emitting diodes ED may be disposed at the steps of the upper surface of the first insulating layer PAS1, and space may be formed between the light-emitting diodes ED and the first insulating layer PAS1.

The bank layer BNL may be disposed on the first insulating layer PAS1. The bank layer BNL may include portions extended in the first direction DR1 and the second direction DR2 and may be around (e.g., may surround) each of the sub-pixels SPXn.

The bank layer BNL may have a height (e.g., a predetermined height) similar to the bank patterns BP1 and BP2. In one or more embodiments, the top surface of the bank layer BNL may have a height higher than that of the bank patterns BP1 and BP2, and the thickness thereof may be equal to or greater than the thicknesses of the bank patterns BP1 and BP2. The bank layer BNL can prevent an ink from overflowing into adjacent sub-pixels SPXn during an inkjet printing process of the process of fabricating the display device 10. The bank layer BNL may include an organic insulating material such as polyimide, like the bank patterns BP1 and BP2.

The light-emitting elements ED may be disposed in the emission area. The light-emitting elements ED may be disposed on the first insulating layer PAS1 between the bank patterns BP1 and BP2 or between the first bank patterns BP1. The direction in which the light-emitting elements ED are extended may be parallel to the upper surface of the first substrate SUB. As will be described later, the light-emitting elements ED may include a plurality of semiconductor layers arranged in the extension direction of the light emitting element ED. The plurality of semiconductor layers may be sequentially arranged along a direction parallel to the upper surface of the first substrate SUB. It should be understood, however, that the present disclosure is not limited thereto. When the light-emitting elements ED have a different structure, a plurality of semiconductor layers may be disposed in a direction perpendicular to the first substrate SUB.

The light-emitting elements ED disposed in each of the sub-pixels SPXn may emit light of different wavelength bands depending on the material of the semiconductor layer. It is, however, to be understood that the present disclosure is not limited thereto. The light-emitting elements ED disposed in each of the sub-pixels SPXn may include the semiconductor layers made of the same material and may emit light of the same color.

The light-emitting elements ED may be disposed on different electrodes RME between different bank patterns BP1 and BP2 or between the first bank patterns BP1. The first light-emitting elements ED1 and the third light-emitting elements ED3 may be disposed between the first bank patterns BP1 and the second bank patterns BP2, and the second light-emitting elements ED2 may be disposed between the first bank patterns BP1 that are spaced from each other.

The arrangement relationship between the light-emitting elements ED1, ED2, and ED3 and the electrodes RME1 and RME2, and between the light-emitting elements ED1, ED2, and ED3 and the connection electrodes CNE have been described above with reference to FIGS. 5 to 8; and, therefore, the redundant descriptions will be omitted.

The light-emitting elements ED may be electrically connected to the electrodes RME and the conductive layers under the via layer VIA in contact with the connection electrodes CNE: CNE1, CNE2, CNE3, and CNE4, and an electric signal may be applied to it so that light of a particular wavelength range can be emitted.

As shown in FIG. 10, a light-emitting element ED may be a light-emitting diode. Specifically, the light-emitting element ED may have a size from nanometers to micrometers and may be an inorganic light-emitting diode made of an inorganic material. The light-emitting element ED may be aligned between two electrodes RME opposing each other as polarities are created by forming an electric field in a particular direction between the two electrodes.

The light-emitting diode ED according to one or more embodiments may have a shape extended in one direction. The light-emitting element ED may have a shape of a cylinder, a rod, a wire, a tube, etc. It is to be understood that the shape of the light-emitting diode ED is not limited thereto. The light-emitting diode ED may have a variety of shapes including a polygonal column shape such as a cube, a cuboid and a hexagonal column, or a shape that is extended in a direction with partially inclined outer surfaces.

The light-emitting diode ED may include semiconductor layers doped with a dopant of a conductive type (e.g., p-type or n-type). The semiconductor layers may emit light of a certain wavelength band by transmitting an electric signal applied from an external power source. The light-emitting diode ED may include a first semiconductor layer 31, a second semiconductor layer 32, an emissive layer 36, an electrode layer 37, and an insulating film 38.

The first semiconductor layer 31 may be an n-type semiconductor. The first semiconductor layer 31 may include a semiconductor material having the following chemical formula: $Al_xGa_yIn_{1-x-y}N$ ($0 \leq x \leq 1$, $0 \leq y \leq 1$, $0 \leq x+y \leq 1$). For example, the first semiconductor layer 31 may be one or more of AlGaInN, GaN, AlGaN, InGaN, AlN and InN doped with n-type dopant. The n-type dopant doped into the first semiconductor layer 31 may be Si, Ge, Sn, Se, etc.

The second semiconductor layer 32 is disposed above the first semiconductor layer 31 with the emissive layer 36 therebetween. The second semiconductor layer 32 may be a p-type semiconductor, and may include a semiconductor material having the following chemical formula: $Al_xGa_yIn_{1-x-y}N$ ($0 \leq x \leq 1$, $0 \leq y \leq 1$, $0 \leq x+y \leq 1$). For example, the second semiconductor layer 32 may be one or more of AlGaInN, GaN, AlGaN, InGaN, AlN, and InN doped with p-type dopant. The p-type dopant doped into the second semiconductor layer 32 may be Mg, Zn, Ca, Ba, etc.

Although each of the first semiconductor layer 31 and the second semiconductor layer 32 is implemented as a signal layer in the drawings, the present disclosure is not limited thereto. Depending on the material of the emissive layer 36, the first semiconductor layer 31 and the second semiconductor layer 32 may further include a larger number of layers, e.g., a clad layer or a tensile strain barrier reducing (TSBR) layer. For example, the light-emitting elements ED may further include another semiconductor layer disposed between the first semiconductor layer 31 and the emissive layer 36 or between the second semiconductor layer 32 and the emissive layer 36. The semiconductor layer disposed between the first semiconductor layer 31 and the emissive layer 36 may be one or more of AlGaInN, GaN, AlGaN, InGaN, AlN, InN and SLs doped with an n-type dopant. The semiconductor layer disposed between the second semiconductor layer 32 and the emissive layer 36 may be one or more of AlGaInN, GaN, AlGaN, InGaN, AlN, and InN doped with a p-type dopant.

The emissive layer 36 is disposed between the first semiconductor layer 31 and the second semiconductor layer 32. The emissive layer 36 may include a material having a single or multiple quantum well structure. When the emissive layer 36 includes a material having the multiple quantum well structure, the structure may include quantum layers and well layers alternately stacked on one another. The emissive layer 36 may emit light as electron-hole pairs are combined therein in response to an electrical signal applied through the first semiconductor layer 31 and the second semiconductor layer 32. The emissive layer 36 may include a material such as AlGaN, AlGaInN, and InGaN. For example, when the emissive layer 36 has a multi-quantum well structure in which quantum layers and well layers are alternately stacked on one another, the quantum layers may include AlGaN or AlGaInN, and the well layers may include a material such as GaN and AlGaN.

The emissive layer 36 may have a structure in which a semiconductor material having a large band gap energy and a semiconductor material having a small band gap energy are alternately stacked on one another, and may include other Group III to Group V semiconductor materials depending on the wavelength range of the emitted light. Accordingly, the light emitted from the emissive layer 36 is not limited to the light of the blue wavelength band. The emissive layer 36 may emit light of red or green wavelength band in some implementations.

The electrode layer 37 may be an ohmic connection electrode. It is, however, to be understood that the present disclosure is not limited thereto. The electrode layer 37 may be a Schottky connection electrode. The light-emitting diode ED may include at least one electrode layer 37. The light-emitting diode ED may include one or more electrode layers 37. It is, however, to be understood that the present disclosure is not limited thereto. The electrode layer 37 may be eliminated.

The electrode layer 37 can reduce the resistance between the light-emitting element ED and the electrodes or the connection electrodes when the light-emitting element ED is electrically connected to the electrodes or the connection electrodes in the display device 10. The electrode layer 37 may include a metal having conductivity. For example, the electrode layer 37 may include at least one of aluminum (Al), titanium (Ti), indium (In), gold (Au), silver (Ag), ITO, IZO, and ITZO.

The insulating film 38 is disposed to be around (e.g., to surround) the outer surfaces (e.g., the outer peripheral or circumferential surfaces) of the plurality of semiconductor layers and electrode layers described above. For example, the insulating film 38 may be disposed to be around (e.g., to surround) at least the outer surface (e.g., the outer peripheral or circumferential surface) of the emissive layer 36, with both ends of the light-emitting element ED in the longitudinal direction exposed. In addition, a part of the upper surface of the insulating film 38 may be rounded in cross section, which is adjacent to at least one of the ends of the light-emitting diode ED.

The insulating film 38 may include materials having insulating properties, for example, at least one of: silicon oxide (SiOx), silicon nitride (SiNx), silicon oxynitride (SiOxNy), aluminum nitride (AlNx), aluminum oxide (AlOx), zirconium oxide (ZrOx), hafnium oxide (HfOx), and titanium oxide (TiOx). Although the insulating film 38 is formed as a single layer in the drawings, the present disclosure is not limited thereto. In one or more embodiments, the insulating film 38 may be made up of a multilayer structure in which multiple layers are stacked on one another.

The insulating film 38 can protect the semiconductor layers and the electrode layer of the light-emitting elements ED. The insulating film 38 can prevent an electrical short-circuit that may occur in the emissive layer 36 if it comes in direct contact with an electrode through which an electric signal is transmitted to the light-emitting diode ED. In addition, the insulating film 38 can prevent a decrease in luminous efficiency.

In addition, the outer surface (e.g., the outer peripheral or circumferential surface) of the insulating film 38 may be subjected to surface treatment. The light-emitting diodes ED may be dispersed in an ink, and the ink may be sprayed onto the electrode. In doing so, a surface treatment may be applied to the insulating layer 38 so that it becomes hydrophobic or hydrophilic in order to keep the light-emitting diodes ED dispersed in the ink from being aggregated with one another.

The second insulating layer PAS2 may be disposed on the light-emitting elements ED, the first insulating layer PAS1 and the bank layer BNL. The second insulating layer PAS2 may be extended in the first direction DR1 between the bank patterns BP1 and BP2 and may include a pattern portion disposed on the plurality of light-emitting elements ED. The pattern portion may be disposed to partially surround the outer surface (e.g., the outer peripheral or circumferential surface) of the light-emitting diodes ED, and may not cover both sides or both ends of the light-emitting diodes ED. The pattern portion may form a linear or island pattern in each sub-pixel SPXn when viewed from the top. The pattern portion of the second insulating layer PAS2 can protect the light-emitting elements ED and can fix the light-emitting elements ED during the process of fabricating the display device 10. In addition, the second insulating layer PAS2 may be disposed to fill the space between light-emitting diodes ED and the first passivation layer PAS1 thereunder.

The connection electrodes CNE; CNE1, CNE2, CNE3, and CNE4 may be disposed on the electrodes RME and the bank patterns BP1 and BP2.

The first connection electrode CNE1 may be disposed on the second electrode RME2 and the second bank pattern BP2. The second connection electrode CNE2 may be disposed on the first electrode RME1 and the second bank pattern BP2. The third connection electrode CNE3 may be disposed on the first electrode RME1 and the first bank pattern BP1, and on the second electrode RME2 and the first bank pattern BP1. The fourth connection electrode CNE4 may be disposed on the second electrode RME2 and the first bank pattern BP1, and on the first electrode RME1 and the first bank pattern BP1.

Each of the first connection electrode CNE1, the second connection electrode CNE2, the third connection electrode CNE3, and the fourth connection electrode CNE4 may be disposed on the second insulating layer PAS2 and may be in contact with the light-emitting elements ED.

The first connection electrode CNE1 may be in contact with the first ends of the first light-emitting elements ED1, The second connection electrode CNE2 may be in contact with the second ends of the third light-emitting elements ED3, the third connection electrode CNE3 may be in contact with the second ends of the first light-emitting elements ED1 and with the first ends of the second light-emitting elements ED2, and the fourth connection electrode CNE4 may be in contact with the second ends of the second light-emitting elements ED2 and with the first ends of the third light-emitting elements ED3.

The connection electrodes CNE may include a conductive material. For example, the connection electrodes CNE may include ITO, IZO, ITZO, aluminum (Al), etc. For example, the connection electrodes CNE may include a transparent conductive material, and lights emitted from the light-emitting elements ED may transmit the connection electrodes CNE to exit.

The third insulating layer PAS3 is disposed on the third connection electrode CNE3, the second connection electrode CNE2 and the second insulating layer PAS2. The third insulating layer PAS3 may be disposed entirely on the second insulating layer PAS2 to cover the third connection electrode CNE3 and the second connection electrode CNE2, and the first connection electrode CNE1 and the fourth connection electrode CNE4 may be disposed on the third insulating layer PAS3.

Each of the above-described first insulating layer PAS1, second insulating layer PAS2, and third insulating layer PAS3 may include an inorganic insulating material or an organic insulating material. For example, each of the first insulating layer PAS1, the second insulating layer PAS2, and the third insulating layer PAS3 may include an inorganic insulating material, or the first insulating layer PAS1 and the third insulating layer PAS3 may include an inorganic insulating material while the second insulating layer PAS2 may include an organic insulating material. Each of the first insulating layer PAS1, the second insulating layer PAS2, and the third insulating layer PAS3 or at least one of them may be formed in a structure in which insulating layers are alternately or repeatedly stacked on one another. According to one or more embodiments of the present disclosure, each of the first insulating layer PAS1, the second insulating layer PAS2, and the third insulating layer PAS3 may be made of at least one of silicon oxide (SiOx), silicon nitride (SiNx), and silicon oxynitride (SiOxNy). The first insulating layer PAS1, the second insulating layer PAS2, and the third insulating layer PAS3 may be made of the same material. Alternatively, some of them may be made of the same material while the other(s) may be made of different material(s), or they may be made of different materials.

Hereinafter, a method of fabricating a display device according to one or more embodiments of the present disclosure will be described.

Figure 11:
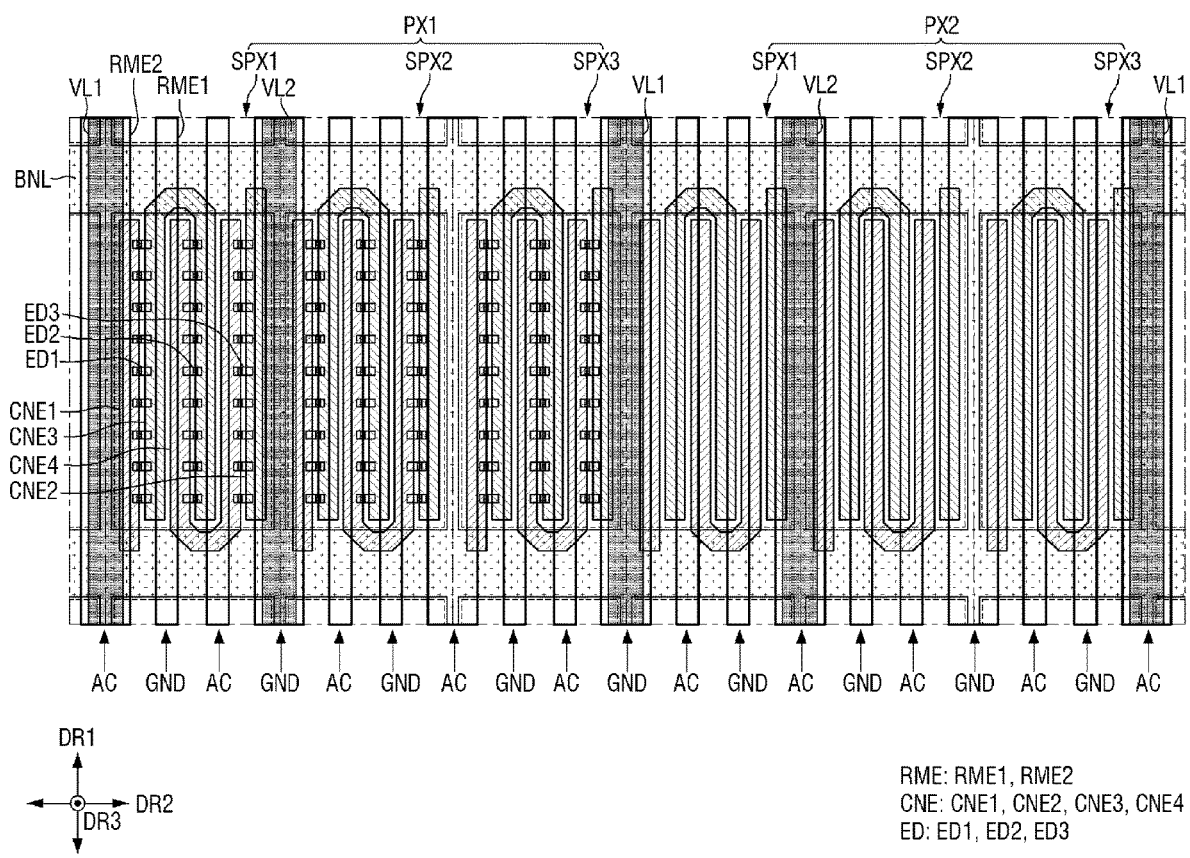
FIG. 11 is a view showing arrangement of light-emitting elements in a first pixel of a method of fabricating a display device according to one or more embodiments.
Figure 12:
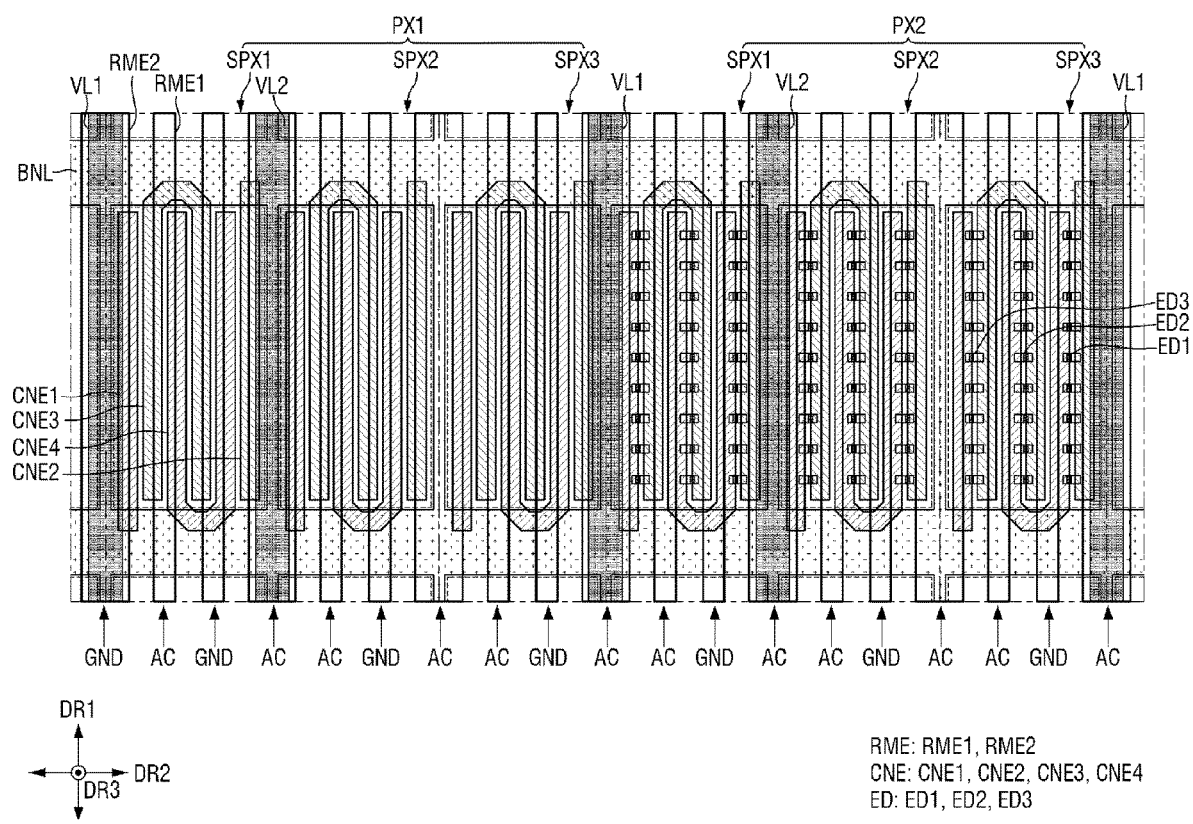
FIG. 12 is a view showing arrangement of light-emitting elements in a second pixel according to a method of fabricating a display device according to one or more embodiments.

FIG. 11 is a view showing arrangement of light-emitting elements in a first pixel of a method of fabricating a display device according to one or more embodiments. FIG. 12 is a view showing arrangement of light-emitting elements in a second pixel of the method of fabricating a display device according to the embodiment.

The method of fabricating a display device will be described with reference to FIGS. 11 and 12 in conjunction with FIGS. 5 to 8.

A method of fabricating a display device according to one or more embodiments of the present disclosure may include: preparing a target substrate SUB, wherein a plurality of pixels PX is defined on the substrate SUB, each of the pixels PX comprising a first sub-pixel SPX1, a second sub-pixel SPX2 adjacent to the first sub-pixel, and a third sub-pixel SPX3 spaced from the first sub-pixel with the second sub-pixel therebetween, wherein first electrodes RME1 and second electrodes RME2 are disposed on the first substrate SUB and disposed in each of the sub-pixels SPX1, SPX2, and SPX3, wherein in the first sub-pixel SPX1, the first electrodes RME1 are extended in a first direction DR1 and are spaced from one another in a second direction DR2 crossing the first direction, the second electrodes RME2 are extended in the first direction DR1 and are spaced from one another with the first electrode RME1 located on the opposite side in the second direction DR2 therebetween, wherein in the second sub-pixel SPX2, the first electrodes RME1 are extended in the first direction DR1 and are spaced from one another in the second direction DR2, the second electrodes RME2 are extended in the first direction DR1 and are spaced from one another with the first electrode RME1 located on one side in the second direction DR2 therebetween, wherein in the third sub-pixel SPX3, the first electrodes RME1 are extended in the first direction DR1 and are spaced from one another in the second direction DR2, the second electrodes RME2 are extended in the first direction DR1 and are spaced from one another with the first electrode RME1 located on the opposite side in the second direction DR2 therebetween; disposing light-emitting elements ED1, ED2, and ED3 in a first pixel PX1; and disposing light-emitting elements ED1, ED2, and ED3 in a second pixel PX2.

As described above, because the arrangements of the sub-pixels SPX1, SPX2, and SPX3 are different whereas the arrangements of the voltage lines VL1 and VL2 are the same in the adjacent pixels PX1 and PX2, there may be an alignment error during the process of disposing (or aligning) the light-emitting elements ED together in the first pixel PX1 and the second pixel PX2.

In this regard, according to the method of fabricating the display device according to the described embodiment, the light-emitting elements ED in the first pixel PX1 and the light-emitting elements ED in the second pixel PX2 are disposed with a time difference, and thus it is possible to prevent an alignment error.

As shown in FIG. 11, when the light-emitting elements ED1, ED2, and ED3 are disposed in the first pixel PX1, a first voltage is applied to the second electrodes RME2 of the first sub-pixel SPX1, the second electrodes RME2 of the second sub-pixel SPX2, and the second the electrodes RME2 of the third sub-pixel SPX3 of the first pixel PX1, and a second voltage smaller than the first voltage is applied to the first electrodes RME1 of the first sub-pixel SPX1, the first electrodes RME1 of the second sub-pixel SPX2, and the first electrode RME1 of the third sub-pixel SPX3 of the first pixel PX1. The first voltage may be a high-level voltage (or AC voltage), and the second voltage may be a low-level voltage (or a ground voltage).

As described above, while the light-emitting elements ED1, ED2, and ED3 are disposed in the first pixel PX1, the second voltage and the first voltage are applied to the electrodes RME1 and RME2, respectively. Although the light-emitting elements ED1, ED2, and ED3 are not disposed in the second pixel PX2, the second voltage and the first voltage are applied to the electrodes RME1 and RME2, respectively, like the first pixel PX1. If the light-emitting elements ED1, ED2, and ED3 are disposed in the first pixel PX1 and the light-emitting elements ED1, ED2, and ED3 are disposed in the second pixel PX2 at the same time, the second electrode RME2 to which the first voltage is applied and the first electrode RME1 to which the second voltage is applied overlap with the second voltage line VL2 to which the low-level voltage is applied and the first voltage line VL1 to which the high-level voltage is applied, respectively. As a result, the first voltage and the second voltage may be changed, and accordingly the alignment of the light-emitting elements ED1, ED2 and ED3 of the second pixel PX2 may be deteriorated.

In this regard, the method of fabricating the display device according to the described embodiment of the present disclosure employs a scheme that when the light-emitting elements ED1, ED2, and ED3 are disposed in the second pixel PX2, the second voltage is applied to the second electrodes RME2 of the first sub-pixel SPX1, the second electrodes RME2 of the second sub-pixel SPX2, and the second the electrodes RME2 of the third sub-pixel SPX3 of the second pixel PX1, while the first voltage is applied to the first electrodes RME1 of the first sub-pixel SPX1, the first electrodes RME1 of the second sub-pixel SPX2, and the first electrodes RME1 of the third sub-pixel SPX3 of the second pixel PX2. In this manner, it is possible to prevent the alignment of the light-emitting elements ED1, ED2, and ED3 of the second pixel PX2 from being deteriorated.

In concluding the detailed description, those skilled in the art will appreciate that many variations and modifications can be made to the embodiments without substantially departing from the principles and scope of the present disclosure. Therefore, the embodiments of the present disclosure are used in a generic and descriptive sense only and not for purposes of limitation.

What is claimed is:

1. A display device comprising:
    a substrate;
    first sub-pixels, second sub-pixels, and third sub-pixels on the substrate, the second sub-pixels being adjacent to the first sub-pixels, and the third sub-pixels being spaced from the first sub-pixels with a respective one of the second sub-pixels therebetween;
    first electrodes and second electrodes on the substrate and located in the sub-pixels;
    first light-emitting elements, second light-emitting elements, and third light-emitting elements on the first electrodes and the second electrodes and located in the sub-pixels, each of the light-emitting elements comprising a first end and a second end opposite to the first end; and
    a first connection electrode, a second connection electrode, a third connection electrode, and a fourth connection electrode on the first to third light-emitting elements and located in the sub-pixels,
    wherein in the first sub-pixel:
    the first electrodes are extended in a first direction and are spaced from one another in a second direction crossing the first direction;
    the second electrodes are extended in the first direction and are spaced from one another with the first electrode located on an opposite side in the second direction therebetween;
    the first light-emitting elements are between the first electrode located on the opposite side in the second direction and the second electrode located on the opposite side in the second direction,
    the second light-emitting elements are between the first electrode located on the opposite side in the second direction and the second electrode located on one side in the second direction,
    the third light-emitting elements are between the first electrode located on the one side in the second direction and the second electrode located on the one side in the second direction,
    the first connection electrode is in contact with the first end of the first light-emitting element,
    the second connection electrode is in contact with the second end of the third light-emitting element,
    the third connection electrode is in contact with the second end of the first light-emitting element and the first end of the second light-emitting element, and
    the fourth connection electrode is in contact with the second end of the second light-emitting element and the first end of the third light-emitting element,
    wherein the first sub-pixel, the second sub-pixel, and the third sub-pixel are repeatedly arranged along the second direction,
    wherein the first end of the first light-emitting element and the first end of the third light-emitting element face the opposite side in the second direction, and
    wherein the first end of the second light-emitting element faces the one side in the second direction opposite to the opposite side in the second direction.

2. The display device of claim 1, wherein in the second sub-pixel, the first electrodes are extended in the first direction and spaced from one another in the second direction, and the second electrodes are extended in the first direction and are spaced from one another with the first electrode located on the one side in the second direction therebetween.

3. The display device of claim 2, wherein in the second sub-pixel,
    the first light-emitting element is between the first electrode located on the opposite side in the second direction and the second electrode located on the opposite side in the second direction,
    the second light-emitting element is between the second electrode located on the opposite side in the second direction and the first electrode located on the one side in the second direction, and
    the third light-emitting element is between the first electrode located on the one side in the second direction and the second electrode located on the one side in the second direction.

4. The display device of claim 3, wherein in the second sub-pixel,
    the first connection electrode is in contact with the second end of the first light-emitting element,
    the second connection electrode is in contact with the first end of the third light-emitting element,
    the third connection electrode is in contact with the first end of the first light-emitting element and the second end of the second light-emitting element, and
    the fourth connection electrode is in contact with the first end of the second light-emitting element and the second end of the third light-emitting element.

5. The display device of claim 4, wherein in the second sub-pixel, the first end of the first light-emitting element and the first end of the third light-emitting element face the one side in the second direction whereas the first end of the second light-emitting element faces the opposite side in the second direction.

6. The display device of claim 5, wherein the first electrode located on the one side in the second direction in the first sub-pixel is same as the first electrode located on the opposite side in the second direction in the second sub-pixel.

7. The display device of claim 6, wherein in the third sub-pixel, the first electrodes are extended in the first direction and spaced from one another in the second direction, and the second electrodes are extended in the first direction and are spaced from one another with the first electrode located on the opposite side in the second direction therebetween.

8. The display device of claim 7, wherein in the third sub-pixel, the first light-emitting element is between the first electrode located on the opposite side in the second direction and the second electrode located on the opposite side in the second direction, the second light-emitting element is between the second electrode located on the one side in the second direction and the first electrode located on the opposite side in the second direction, and the third light-emitting element is between the first electrode located on the one side in the second direction and the second electrode located on the one side in the second direction.

9. The display device of claim 8, wherein in the third sub-pixel, the first connection electrode is in contact with the first end of the first light-emitting element, the second connection electrode is in contact with the second end of the third light-emitting element, the third connection electrode is in contact with the second end of the first light-emitting element and the first end of the second light-emitting element, and the fourth connection electrode is in contact with the second end of the second light-emitting element and the first end of the third light-emitting element.

10. The display device of claim 9, wherein in the third sub-pixel, the first end of the first light-emitting element and the first end of the third light-emitting element face the opposite side in the second direction whereas the first end of the second light-emitting element faces the one side in the second direction.

11. The display device of claim 10, wherein the first electrode located on the one side in the second direction in the first sub-pixel is same as the first electrode located on the opposite side in the second direction in the second sub-pixel.

12. The display device of claim 11, further comprising: a first voltage line and a second voltage line between the substrate and the first electrodes, and between the substrate and the second electrodes.

13. The display device of claim 12, wherein the first voltage line overlaps with a boundary between the first sub-pixel and the third sub-pixel when viewed from top, and wherein the second voltage line overlaps with a boundary between the first sub-pixel and the second sub-pixel when viewed from the top.

14. The display device of claim 13, wherein the first voltage line is a high-level voltage line, and the second voltage line is a low-level voltage line.

15. The display device of claim 12, wherein the first voltage line overlaps with the second electrode located on the opposite side in the second direction of the first sub-pixel.

16. The display device of claim 15, wherein the second voltage line overlaps with the first electrode located on the one side in the second direction of the first sub-pixel.

17. A method of fabricating a display device, the method comprising:

preparing a substrate, wherein a plurality of pixels is on the substrate, each of the plurality of pixels comprising a first sub-pixel, a second sub-pixel adjacent to the first sub-pixel, and a third sub-pixel spaced from the first sub-pixel with the second sub-pixel therebetween, wherein first electrodes and second electrodes are on the substrate and located in the sub-pixels, wherein in the first sub-pixel, the first electrodes are extended in a first direction and are spaced from one another in a second direction crossing the first direction, the second electrodes are extended in the first direction and are spaced from one another with the first electrode located on an opposite side in the second direction therebetween, wherein in the second sub-pixel, the first electrodes are extended in the first direction and are spaced from one another in the second direction, the second electrodes are extended in the first direction and are spaced from one another with the first electrode located on one side in the second direction therebetween, and wherein in the third sub-pixel, the first electrodes are extended in the first direction and are spaced from one another in the second direction, the second electrodes are extended in the first direction and are spaced from one another with the first electrode located on the opposite side in the second direction therebetween;

disposing light-emitting elements in one pixel of the plurality of pixels; and disposing light-emitting elements in another pixel adjacent to the one pixel in the second direction from among the plurality of pixels, wherein the disposing the light-emitting elements in the one pixel comprises:

applying a first voltage to the second electrodes of the first sub-pixel, the second electrodes of the second sub-pixel, and the second electrodes of the third sub-pixel of the one pixel, and applying a second voltage to the first electrodes of the first sub-pixel, the first electrodes of the second sub-pixel, and the first electrodes of the third sub-pixel of the one pixel, the second voltage being smaller than the first voltage.

18. The method of claim 17, wherein the disposing the light-emitting elements in the another pixel comprises:

applying the second voltage to the second electrodes of the first sub-pixel, the second electrodes of the second sub-pixel, and the second electrodes of the third sub-pixel of the another pixel, and applying the first voltage to the first electrodes of the first sub-pixel, the first electrodes of the second sub-pixel, and the first electrodes of the third sub-pixel of the another pixel.

19. The method of claim 18, wherein the preparing the substrate comprises:

disposing a first voltage line and a second voltage line between the substrate and the first electrodes, and between the substrate the second electrodes, wherein the first voltage line overlaps with the second electrode located on the opposite side in the second direction of the first sub-pixel, and wherein the second voltage line overlaps with the first electrode located on the one side in the second direction of the first sub-pixel.

20. The method of claim 19, wherein each of the light-emitting elements of the one pixel and the light-emitting elements of the another pixel comprises a first end and a second end opposite to the first end, and wherein the first end of each of the light-emitting elements of the one pixel and the first end of each of the light-emitting elements of the another pixel face a same side in the second direction.

* * * * *